United States Patent
Patel et al.

(10) Patent No.: US 10,193,580 B2
(45) Date of Patent: Jan. 29, 2019

(54) MULTI-BAND RADIO-FREQUENCY RECEPTION

(71) Applicant: QUALCOMM Incorporated, San Diego, CA (US)

(72) Inventors: Chirag Dipak Patel, San Diego, CA (US); Lai Kan Leung, San Marcos, CA (US); Xinmin Yu, San Diego, CA (US); Timothy Donald Gathman, San Diego, CA (US); Ravi Sridhara, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/927,022

(22) Filed: Mar. 20, 2018

(65) Prior Publication Data

US 2018/0278277 A1 Sep. 27, 2018

Related U.S. Application Data

(60) Provisional application No. 62/475,078, filed on Mar. 22, 2017.

(51) Int. Cl.
*H04B 1/00* (2006.01)
*H03F 3/72* (2006.01)
(Continued)

(52) U.S. Cl.
CPC ............ *H04B 1/0067* (2013.01); *H03F 1/42* (2013.01); *H03F 3/245* (2013.01); *H03F 3/72* (2013.01); *H04B 1/005* (2013.01); *H04B 1/719* (2013.01)

(58) Field of Classification Search
CPC .... H04B 1/0053; H04B 1/006; H04B 1/0067; H04B 1/0075; H04B 1/0092
(Continued)

(56) References Cited

U.S. PATENT DOCUMENTS

| 7,006,805 B1 | 2/2006 | Sorrells et al. |
| 7,653,163 B2 | 1/2010 | Sadri et al. |

(Continued)

FOREIGN PATENT DOCUMENTS

| CN | 103209147 A | 7/2013 | |
| JP | 2005204230 A | * 7/2005 | ........... H04B 1/0053 |

OTHER PUBLICATIONS

Wang S., et al., "CMOS/IPD Switchable Bandpass Circuit for 28/39 GHz Fifth-Generation Applications", IET Microwaves, Antennas and Propagation, The Institution of Engineering and Technology, vol. 10, No. 14, Mar. 2016, pp. 1461-1466.

(Continued)

*Primary Examiner* — Lee Nguyen
(74) *Attorney, Agent, or Firm* — Holland & Hart LLP/Qualcomm

(57) ABSTRACT

Devices and techniques are described to extract specific frequency band signals from a wide-band radio-frequency signal. A network entity may include an antenna for receiving the wide-band radio-frequency signal and may include a receiver circuit for processing the wide-band radio-frequency signal. The receiver circuit may include a transconductance amplifier and a plurality of single-band circuits. The transconductance amplifier may be configured to generate an amplified wide-band radio-frequency signal and send it to one or more of the single-band circuits. Each single-band circuit may be configured to extract a different frequency band signal from the amplified wide-band radio-frequency signal.

25 Claims, 16 Drawing Sheets

(51) Int. Cl.
   *H03F 3/24*    (2006.01)
   *H03F 1/42*    (2006.01)
   *H04B 1/06*    (2006.01)
   *H04B 1/719*   (2011.01)

(58) Field of Classification Search
   USPC .......... 455/168.1, 188.1, 189.1, 190.1, 191.1
   See application file for complete search history.

(56) References Cited

U.S. PATENT DOCUMENTS

| | | | | |
|---|---|---|---|---|
| 7,973,603 | B2* | 7/2011 | Kammula | H03F 3/45179 330/188 |
| 8,294,515 | B1* | 10/2012 | Riekki | H03F 3/45179 330/283 |
| 2002/0140601 | A1* | 10/2002 | Sanada | H01Q 3/267 342/368 |
| 2008/0112519 | A1 | 5/2008 | Jung et al. | |
| 2013/0052973 | A1 | 2/2013 | Mo et al. | |
| 2016/0218852 | A1 | 7/2016 | Akula | |
| 2017/0171791 | A1 | 6/2017 | Li et al. | |

OTHER PUBLICATIONS

International Search Report and Written Opinion—PCT/US2018/023623—ISA/EPO—dated Jun. 5, 2018 (173067WO).

* cited by examiner

MULTI-BAND RADIO-FREQUENCY RECEPTION

CROSS REFERENCE

The present Application for Patent claims priority to U.S. Provisional Patent Application No. 62/475,078 by Patel, et al., entitled "Multi-Band Millimeter Wave Reception," filed Mar. 22, 2017, assigned to the assignee hereof, the entirety of which is incorporated herein by reference.

BACKGROUND

The following relates generally to wireless communication, and more specifically to multi-band millimeter-wave reception.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system, or a New Radio (NR) system). A wireless multiple-access communications system may include a number of base stations or access network nodes, each simultaneously supporting communication for multiple communication devices, which may be otherwise known as user equipment (UE).

Some wireless communications systems, such as NR systems, may use millimeter waves (e.g., high-frequency signals) to form directional communication links used to communicate data. Phased-array antennas and beamforming techniques may be used to generate the directional communication links. In some examples, problems occur based on multi-band operation due to the fragmented nature of carrier frequency band allocations.

SUMMARY

The described techniques relate to improved methods, systems, devices, or apparatuses that support multi-band radio-frequency reception. Generally, the described devices and techniques facilitate extracting specific frequency band signals from an amplified wide-band radio-frequency signal. A network entity may include an antenna for receiving the wide-band radio-frequency signal and may include a receiver circuit for processing the wide-band radio-frequency signal. The receiver circuit may include a transconductance amplifier and a plurality of single-band circuits. The transconductance amplifier may be configured to generate an amplified wide-band radio-frequency signal based on receiving the wide-band radio-frequency signal and send the amplified wide-band radio-frequency signal to one or more of the single-band circuits. Each single-band circuit may be configured to extract a different frequency band signal from the amplified wide-band radio-frequency signal. The single-band circuits may, in some cases, be tied to a common output path that sends the output signals to processing circuitry.

In one embodiment, a device or system may include a plurality of single-band circuits, each single-band circuit being tuned to a different frequency band, and an amplifier coupled with the plurality of single-band circuits and configured to receive a wide-band radio-frequency signal and select a single-band circuit from the plurality of single-band circuits, each single-band circuit configured to: extract a selected frequency band signal from an amplified wide-band radio-frequency signal received from the amplifier, and downconvert the selected frequency band signal.

A method of for wireless communication is described. The method may include receiving a wide-band radio-frequency signal from an antenna, generating an amplified wide-band radio-frequency signal based at least in part on receiving the wide-band radio-frequency signal from the antenna, selecting a single-band circuit from a plurality of single-band circuits based at least in part on generating the amplified wide-band radio-frequency signal, each single-band circuit of the plurality of single-band circuits being tuned to a different frequency band, extracting a selected frequency band signal having a first center frequency from the amplified wide-band radio-frequency signal based at least in part on the selected single-band circuit, and downconverting the selected frequency band signal to an output signal having a second center frequency different from the first center frequency.

An apparatus for wireless communication is described. The apparatus may include means for receiving a wide-band radio-frequency signal from an antenna, means for generating an amplified wide-band radio-frequency signal based at least in part on receiving the wide-band radio-frequency signal from the antenna, means for selecting a single-band circuit from a plurality of single-band circuits based at least in part on generating the amplified wide-band radio-frequency signal, each single-band circuit of the plurality of single-band circuits being tuned to a different frequency band, means for extracting a selected frequency band signal having a first center frequency from the amplified wide-band radio-frequency signal based at least in part on the selected single-band circuit, and means for downconverting the selected frequency band signal to an output signal having a second center frequency different from the first center frequency.

Another apparatus for wireless communication is described. The apparatus may include a processor, memory in electronic communication with the processor, and instructions stored in the memory. The instructions may be operable to cause the processor to receive a wide-band radio-frequency signal from an antenna, generate an amplified wide-band radio-frequency signal based at least in part on receiving the wide-band radio-frequency signal from the antenna, select a single-band circuit from a plurality of single-band circuits based at least in part on generating the amplified wide-band radio-frequency signal, extract a selected frequency band signal having a first center frequency from the amplified wide-band radio-frequency signal based at least in part on the selected single-band circuit, and downconvert the selected frequency band signal to an output signal having a second center frequency different from the first center frequency.

A non-transitory computer readable medium for wireless communication is described. The non-transitory computer-readable medium may include instructions operable to cause a processor to receive a wide-band radio-frequency signal from an antenna, generate an amplified wide-band radio-frequency signal based at least in part on receiving the wide-band radio-frequency signal from the antenna, select a single-band circuit from a plurality of single-band circuits based at least in part on generating the amplified wide-band radio-frequency signal, extract a selected frequency band signal having a first center frequency from the amplified wide-band radio-frequency signal based at least in part on the selected single-band circuit, and downconvert the selected frequency band signal to an output signal having a second center frequency different from the first center frequency.

DETAILED DESCRIPTION

In some wireless communications systems, carrier frequency band allocations may be continuous along a frequency spectrum band. In contrast, some carrier frequency band allocations may be fragmented along a frequency spectrum band. Consequently, some receivers may be multi-band receivers configured to extract the desired carrier frequency bands from an overall frequency spectrum band. For certain radio-frequency signals such as millimeter-wave signals, building such a multi-band receiver may pose certain challenges.

In some examples of wireless communication systems (e.g., fourth generation (4G) Long Term Evolution (LTE)) that support carrier aggregation (CA), a signal may be processed (i.e., directed) from a same band to one or more mixers for inter-band or intra-band CA. As such, all elements in a signal path may be narrowband and all signal paths may be tuned to a same band including the input and the output. In addition, the mixer outputs might not be recombined and subsequent modules may be separated in the signal path. Thereby the CA techniques use a single-input and multiple-output for a single frequency spectrum band.

Devices and techniques are described to extract specific frequency band signals from a wide-band radio-frequency signal. A network entity may include an antenna for receiving the wide-band radio-frequency signal and may include a receiver circuit for processing the wide-band radio-frequency signal. The receiver circuit may include a single input for many single frequency spectrum bands and single output for many single frequency spectrum bands. The receiver circuit may include transconductance amplifier and a plurality of single-band circuits that may be configured to receive one frequency while filtering out other frequencies. For example, the transconductance amplifier may be configured to receive the wide-band radio-frequency signal from the antenna, generate an amplified wide-band radio-frequency signal based on receiving the wide-band radio-frequency signal, and send the amplified wide-band radio-frequency signal to one or more of the single-band circuits. Each single-band circuit may be configured to extract a different frequency band signal from the amplified wide-band radio-frequency signal. The single-band circuits may be tied to a common output path that sends the output signals to processing circuitry. As such, the devices and techniques described herein use a single-input and single-output for processing multiple frequency spectrum bands.

Aspects of the disclosure are initially described in the context of a wireless communications system. Aspects of the disclosure are illustrates by and described with reference to circuit diagrams. Aspects of the disclosure are further illustrated by and described with reference to apparatus diagrams, system diagrams, and flowcharts that relate to multi-band radio-frequency reception.

Figure 1:
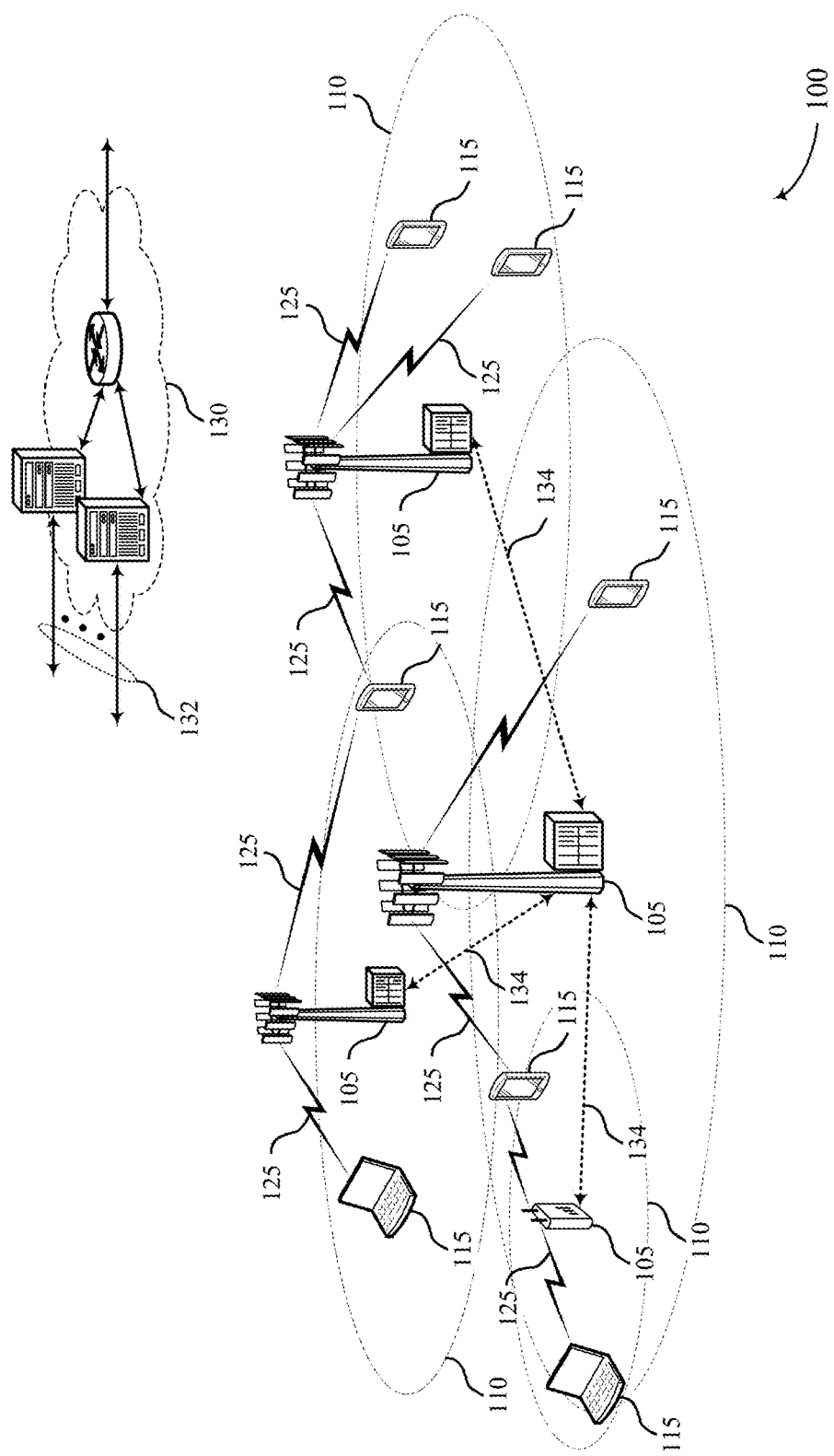
FIG. 1 illustrates an example of a system for wireless communication that supports multi-band radio-frequency reception in accordance with aspects of the present disclosure.

FIG. 1 illustrates an example of a wireless communications system 100 in accordance with various aspects of the present disclosure. The wireless communications system 100 includes base stations 105, UEs 115, and a core network 130. In some examples, the wireless communications system 100 may be a LTE, LTE-Advanced (LTE-A) network, or a New Radio (NR) network. In some cases, wireless communications system 100 may support enhanced broadband communications, ultra-reliable (i.e., mission critical) communications, low latency communications, and communications with low-cost and low-complexity devices. In some examples, base station 105 and UEs 115 may include phased-array antennas to establish directional communication links using millimeter-wave signals. Carrier frequency bands for millimeter-wave signals may not be contiguous in the frequency spectrum band. To receive different non-contiguous frequency bands, a receiver may include a selection circuit and a plurality of single-band circuits to extract specific frequency band signals from a wide-band radio-frequency signal. In some cases, the wide-band radio-frequency signal may be a wide-band millimeter-wave signal comprising a subset of frequency bands of the radio frequency spectrum.

Base stations 105 may wirelessly communicate with UEs 115 via one or more base station antennas. Each base station 105 may provide communication coverage for a respective geographic coverage area 110. Communication links 125 shown in wireless communications system 100 may include uplink transmissions from a UE 115 to a base station 105, or downlink transmissions, from a base station 105 to a UE 115. Control information and data may be multiplexed on an uplink channel or downlink according to various techniques. Control information and data may be multiplexed on a downlink channel, for example, using time division multiplexing (TDM) techniques, frequency division multiplexing (FDM) techniques, or hybrid TDM-FDM techniques. In some examples, the control information transmitted during a transmission time interval (TTI) of a downlink channel may be distributed between different control regions in a cascaded manner (e.g., between a common control region and one or more UE-specific control regions).

UEs 115 may be dispersed throughout the wireless communications system 100, and each UE 115 may be stationary or mobile. A UE 115 may also be referred to as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may also be a cellular phone, a personal digital assistant (PDA), a wireless modem, a wireless communication device, a handheld device, a tablet computer, a laptop computer, a cordless phone, a personal electronic device, a handheld device, a personal computer, a wireless local loop (WLL) station, an Internet of Things (IoT) device, an Internet of Everything (IoE) device, a machine type communication (MTC) device, an appliance, an automobile, or the like.

Thus, wireless communications system 100 may support millimeter wave (mmW) communications between UEs 115 and base stations 105. Devices operating in mmW or extremely high frequency bands may have multiple antennas to allow beamforming. That is, a base station 105 may use multiple antennas or antenna arrays to conduct beamforming operations for directional communications with a UE 115. Beamforming (which may also be referred to as spatial filtering or directional transmission) is a signal processing technique that may be used at a transmitter (e.g., a base station 105) to shape and/or steer an overall antenna beam in the direction of a target receiver (e.g., a UE 115). This may be achieved by combining elements in an antenna array in such a way that transmitted signals at particular angles experience constructive interference while others experience destructive interference.

Figure 2:
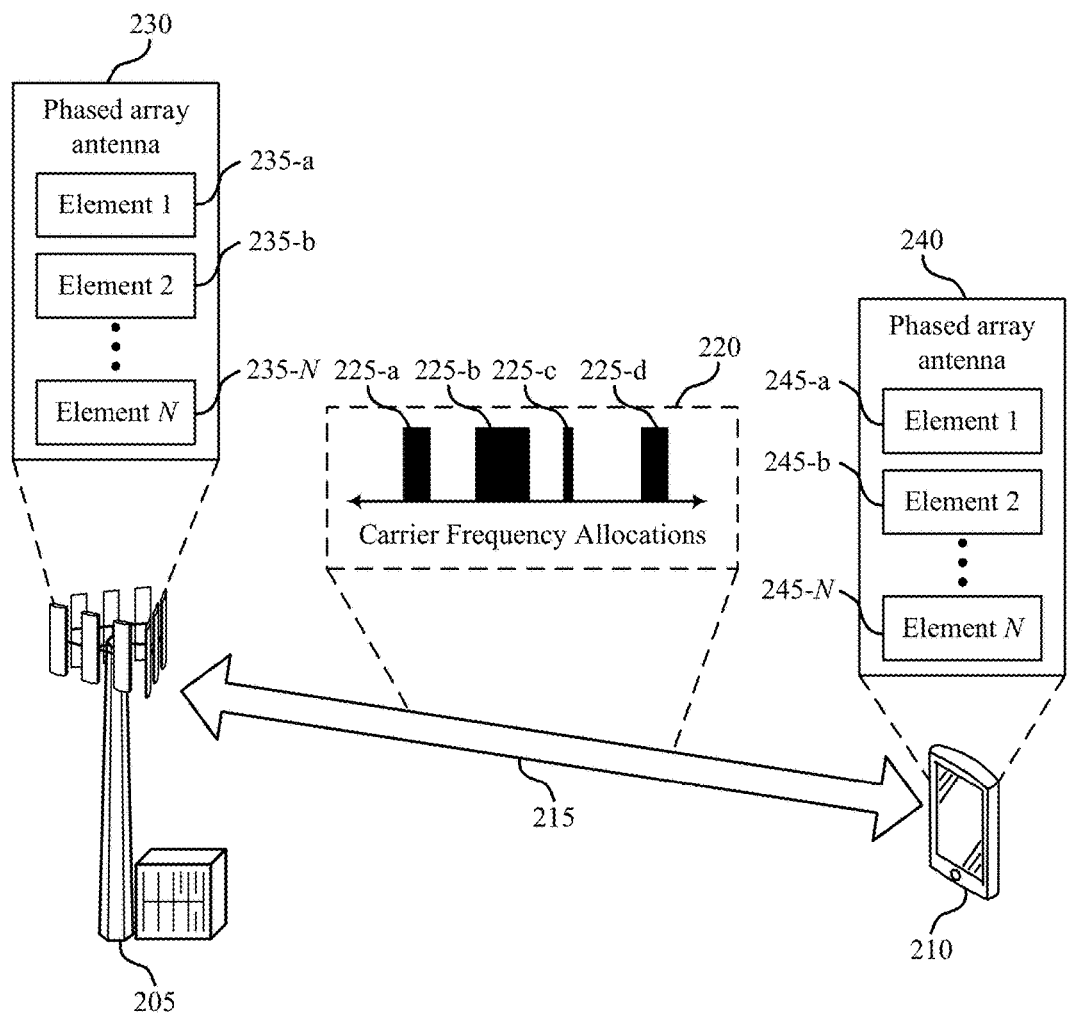
FIG. 2 illustrates an example of a wireless communications system that supports multi-band radio-frequency reception in accordance with aspects of the present disclosure.

FIG. 2 illustrates an example of a wireless communications system 200 that supports multi-band radio-frequency reception in accordance with various aspects of the present disclosure. The wireless communications system 200 may include a base station 205 and a UE 210 communicating using a directional communication link 215. Radio-frequency signals, such as millimeter-wave signals, may be communicated using the directional communication link 215. The base station 205 may be an example of the base stations 105 described with reference to FIG. 1. The UE 210 may be an example of the UEs 115 described with reference to FIG. 1.

Directional communication links 215 may provide a high-bandwidth link between a base station 205 and a UE 210. Signal processing techniques, such as beamforming, may be used to coherently combine energy to form the directional communication link. Wireless communication links achieved through beamforming may be associated with narrow beams (e.g., "pencil beams") that are highly directional, minimize inter-link interference, and provide high-bandwidth links between wireless nodes (e.g., base stations, access nodes, UEs). Such directional beams may serve a limited geographic area. In addition, directional beams be generated in an analog or digital manner.

Due to the limited geographic area served by directional communication links 215, as a UE 210 moves throughout the coverage of the wireless communications system 200, the directional communication links 215 may be refined to maintain the quality of the communication link. Beam refinement procedures may be implemented by either the base station 205, the UE 210, or combinations thereof to refine the targeting of the directional beams.

Directional communication links 215 may comprise radio-frequency signals including millimeter-wave signals. Millimeter-wave signals may be communicated using frequency spectrum bands that are higher than other wireless communication systems. For example, millimeter-wave signals may be between 15 GHz and 50 GHz. The carrier frequency band allocations used for millimeter-wave communication (e.g., directional communication links 215) might not be continuous on the frequency spectrum. In other words, the carrier frequency band allocations for communicating using directional communication links 215 in the wireless communications system 200 may be fragmented.

For example, box 220 illustrates frequency spectrum having a plurality of carrier frequency bands 225 allocated to the wireless communications system 200 for use by radio-frequency signals such as millimeter-wave signals. For example, the carrier frequency bands 225-a, 225-b, 225-c, and/or 225-d may be allocated in a fragmented manner. The other intervening frequencies may be allocated to other uses. The allocated carrier frequency bands 225 are shown for illustrative purposes only and do not represent actual allocations of frequency bands for a specific purpose.

To communicate using the directional communication link 215 the base station 205 may include a phased-array antenna 230 having a plurality of elements 235. The base station 205 may perform beamforming techniques using the phased-array antenna 230 to generate a directional beams. To communicate using the directional communication link 215 the UE 210 may include a phased-array antenna 240 having a plurality of elements 245. The base station 205 or the UE 210, or both may be configured with a buffer that may combine multiple different elements of the phased-array antenna 230 or 240, or both. In some cases, the base station 205 and/or the UE 210 may use a same buffer for multiple different elements of the phased-array antenna 230 and/or 240. The base station 205 may perform beamforming techniques using the phased-array antenna 240 to generate a directional beams.

Figure 3:
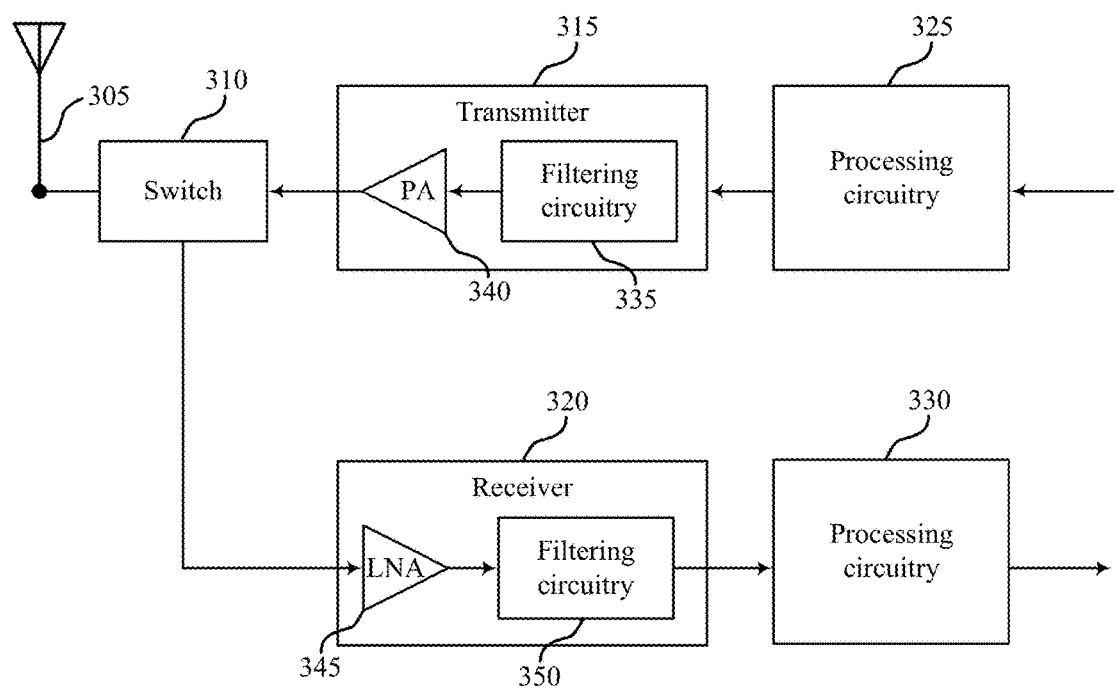
FIG. 3 illustrates an example of a circuit that supports multi-band radio-frequency reception in accordance with aspects of the present disclosure.

FIG. 3 illustrates an example of a circuit 300 that supports multi-band radio-frequency reception in accordance with various aspects of the present disclosure. The circuit 300 may depict a portion of a transceiver circuit associated with an element 235, 245 of a phased-array antenna 230, 240. The circuit includes an antenna 305, a switch 310, a transmitter 315, a receiver 320, and processing circuitry 325, 330. The antenna 305 may be an example of an element 235, 245 described with reference to FIG. 2.

In the circuit 300, the same antenna 305 may be used for both transmission and reception. The switch 310 may be configured to selectively couple the antenna 305 with either the transmitter 315 or the receiver 320.

The transmitter 315 may receive data to transmit from the processing circuitry 325. The transmitter 315 may include filtering circuitry 335 and a power amplifier 340 to process the data for transmission by the antenna 305.

The present disclosure describes devices and techniques related to the receiver 320 used for receiving multiple carrier frequency bands of radio-frequency signals such as millimeter-wave signals. The receiver 320 may include a low-noise amplifier (LNA) 345 and filtering circuitry 350 to prepare a received signal for processing by the processing circuitry 330.

Due to the fragmented nature of carrier frequency band allocations for certain radio-frequency signals such as millimeter-wave signals, it may be advantageous for a receiver 320 to be capable of receiving multiple frequency bands using the same transceiver circuit. In some examples, different paths having electrical components may be positioned between the antenna 305 and the LNA 345 to receive multi-band millimeter-wave signals. These examples may require changes to the transmitter circuit, may be costly due to the amount of components and the cost of individual components at millimeter wave frequencies, and may be lossy. In another example, a receiver 320 may use a tunable circuit receive multi-band millimeter-wave signals. Tunable circuits at millimeter wave frequencies may be lossy. In other examples, a receiver 320 may be configured to accept a wide-band radio-frequency signal. Wide-band radio-frequency signal designs, however, may consume a large amount of power due to amplifying frequencies that are not relevant. In addition, amplifying all frequencies in a wide-band creates other noise and system issues. A design for a receiver 320 is described herein that addresses some of the issues described.

Figure 4:
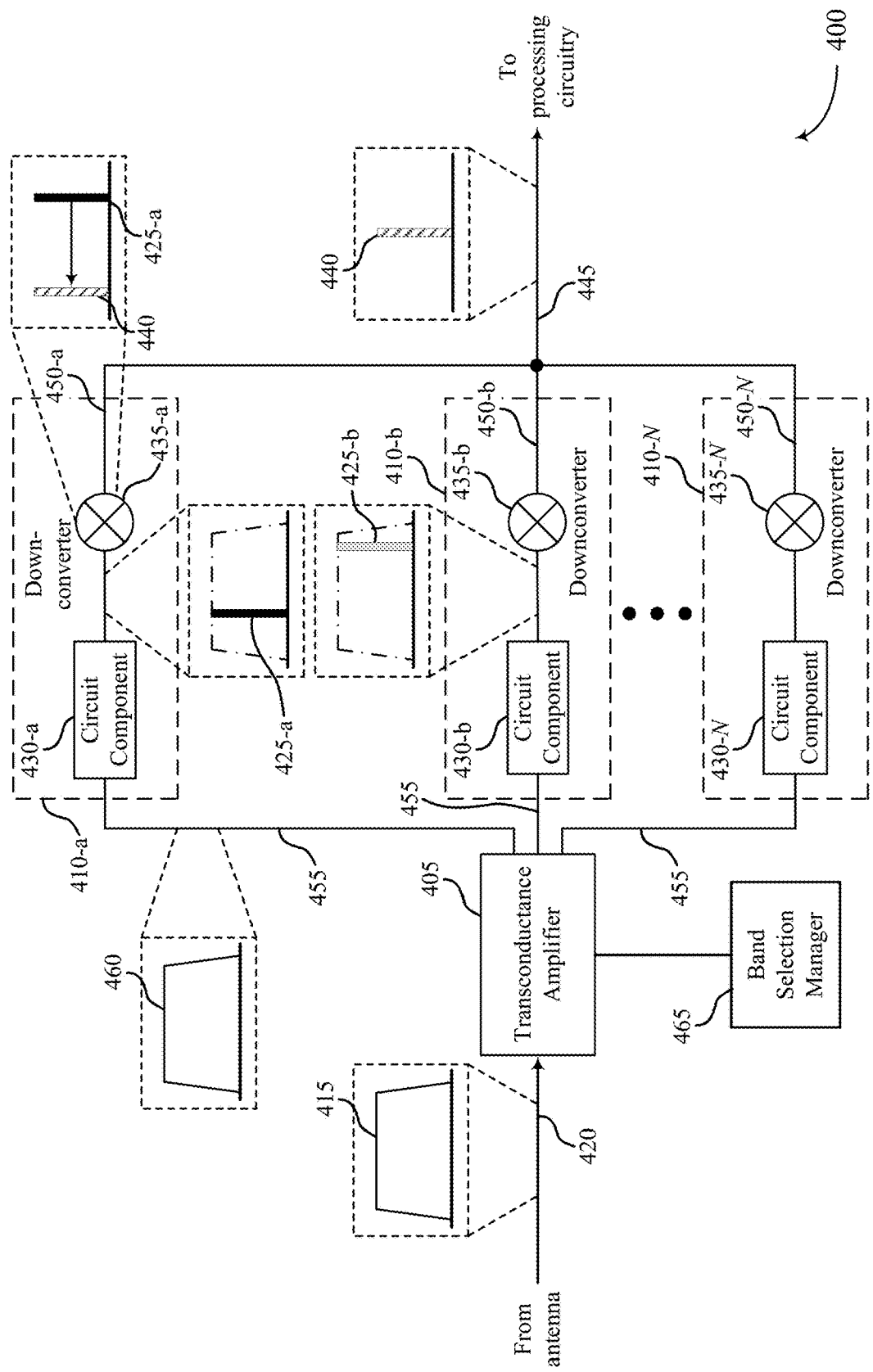
FIG. 4 illustrates an example of a receiver that supports multi-band radio-frequency reception in accordance with aspects of the present disclosure.

FIG. 4 illustrates an example of a receiver 400 that supports multi-band radio-frequency reception in accordance with various aspects of the present disclosure. The receiver 400 may be configured to receive multiple bands of radio-frequency signals such as millimeter-wave signals using the same receiver circuit. The receiver 400 may be configured to couple to an element (not shown) of a phased-array antenna. The receiver 400 may be an example of the receiver 320 described with reference to FIG. 3. The receiver 400 may include transconductance amplifier 405, and a plurality of single-band circuits 410. The plurality of single-band circuits 410 may be configured to extract single-band signals from a wide-band signal, amplify single-band signals, or a combination thereof.

The transconductance amplifier 405 may be configured to perform a number of functions, including generating an amplified wide-band radio-frequency signal from the received wide-band radio-frequency signal, selecting one of the single-band circuits 410, and sending the amplified wide-band radio-frequency signal to the selected single-band circuit 410. The transconductance amplifier 405 may receive a wide-band radio-frequency signal 415 from an antenna (not shown) via an input path 420. The wide-band radio-frequency signal 415 may be wide-enough to include the fragmented carrier frequency band used to transmit radio-frequency signals such as millimeter-wave signals. In some examples, the wide-band radio-frequency signal 415 includes 28 GHz carrier frequency bands and 39 GHz carrier frequency bands.

The transconductance amplifier 405 may be configured to generate an amplified wide-band radio-frequency signal 460 based on the wide-band radio-frequency signal 415. The transconductance amplifier 405 may be an example of the LNA or may include an LNA such as the LNA 345 described with reference to FIG. 3. In some examples, the selection functionality of the transconductance amplifier 405 may be integrated into the LNA 345. In some examples, the transconductance amplifier 405 may include cascode transistors. The input impedance of transconductance amplifier 405 may also be configured to match impedance of the circuits associated with the antenna (not shown) to which it is connected.

The transconductance amplifier 405 may be configured to select one of the single-band circuits 410 based on control information or a control signal received from a band selection manager 465. The band selection manager 465 may be configured to apply a signal to the gate of one or more cascode transistors, thereby activating the transistor and selecting the desired single-band circuit 410. The band selection manager 465 may be an example of a controller for a receiver, transmitter, or transceiver of a UE 210. In some cases, the control information may be associated with the wide-band radio-frequency signal 415. For example, wireless communication control information may indicate that data is being transmitted by some other device (e.g., a base station) using a particular carrier frequency band. The antenna may receive the wide-band radio-frequency signal 415 that includes the particular carrier frequency band. The receiving entity (e.g., UE 210) may decode the wireless communication control information and transmit selection circuit control information to the transconductance amplifier 405 based on the wireless communication control information. As part of selecting the single-band circuit 410-a, the transconductance amplifier 405 may send the amplified wide-band radio-frequency signal 460 to the selected single-band circuit 410-a. A specific example of a selection circuit is described in more detail with reference to FIG. 6.

In some cases, the transconductance amplifier 405 may be configured to select multiple single-band circuits 410 simultaneously. In these cases, the transconductance amplifier 405 may be configured to send the amplified wide-band radio-frequency signal 415 to multiple single-band circuits 410 at the same time. Such cases may be useful when the wireless communications system 200 uses carrier aggregation for radio-frequency signals such as millimeter-wave signals.

In some examples, receiver 400 may include two independent output paths 450, each output path configured to receive a different single-band signal (e.g., selected frequency band signal or frequency band signal) at the same time. Each single-band circuit 410 may include a first downconverter 435 coupled with a first output path 450, the first downconverter 435 configured to shift a center frequency of the selected frequency band signal from a first value to a second value different from the first value.

The receiver 400 may include a plurality of single-band circuits 410. Each single-band circuit 410 may be optimized to extract a different frequency band signal from the amplified wide-band radio-frequency signal 460 generated based on the wide-band radio-frequency signal 415 received by an antenna (e.g., an element of a phased-array antenna). Each single-band circuit 410 may include electrical components optimized to extract a particular carrier frequency band from the amplified wide-band radio-frequency signal 460. As such, each single-band circuit 410 generates a selected frequency band signal from the amplified wide-band radio-frequency signal 460. In some examples, each single-band circuit 410 may extract the selected frequency band signal from the amplified wide-band radio-frequency signal 460. In some examples, each single-band circuit 410 may filter the amplified wide-band radio-frequency signal 460 to extract a selected frequency band signal. Each single-band circuit 410 may be coupled with an output port 455 of the transconductance amplifier 405.

For example, a first single-band circuit 410-*a* may be configured to extract a first selected frequency band signal 425-*a* from the amplified wide-band radio-frequency signal 460. The selected frequency band signal 425-*a* may have a number of characteristics including a center frequency and a bandwidth. In some cases, the first selected frequency band signal 425-*a* may have a center frequency of about 28 GHz. In another example, a second single-band circuit 410-*b* may be configured to extract a second selected frequency band signal 425-*b* from the amplified wide-band radio-frequency signal 460. The second selected frequency band signal 425-*b* being different from the first selected frequency band signal 425-*a*. In some cases, the second selected frequency band signal 425-*b* may have a center frequency about 39 GHz. The receiver 400 may include any number of single-band circuits 410 optimized to extract any number of selected frequency band signals or carrier frequency bands from the amplified wide-band radio-frequency signal 460.

In some examples, the single-band circuits 410 may be arranged in a parallel circuit configuration. In some examples, the single-band circuits 410 may be referred to as single-band extraction circuits. In some examples, the single-band circuits 410 may be referred to as single-band paths. In some examples, the number of single-band circuits 410 may be equal to the number of discrete carrier frequency bands included in the wide-band radio-frequency signal 415 and/or the amplified wide-band radio-frequency signal 460. In some examples, the term carrier frequency band may be used interchangeable with the term selected frequency band signal or single-band signal.

A single-band circuit 410 may include a circuit component 430 and a downconverter 435. The circuit component 430 may be configured as an amplifier or tuned circuit, or both for a single-band. For example, the circuit component 430 may be configured to filter the amplified wide-band radio-frequency signal 460 to obtain the desired frequency band signal 425. The circuit component 430 may be coupled to an output port of the transconductance amplifier 405. In some examples, the circuit component 430 is a tuned circuit. The circuit component 430 may be made up of any number of analog components such as capacitors, inductors, resistors, amplifiers or transformers. In some examples, the circuit component 430 includes digital components and digital logic. Specific examples of the circuit component 430 are described in greater detail with reference to FIGS. 5A and 5B.

The downconverter 435 may be configured to downconvert the selected frequency band signal to an intermediate frequency. In some instances, it may be advantageous to change the frequency of the selected frequency band signal for processing. While millimeter waves may be useful for transmitting information wirelessly, building processing circuitry that operates at the frequencies of millimeter waves may be prohibitive (cost, space, etc.). In some examples, the intermediate frequency may be about 10 GHz. The downconverter 435 may generate an output signal 440 based on the selected frequency band signal 425. The output signal 440 may include a center frequency and a bandwidth. The center frequency of the output signal may be about 10 GHz, in some examples.

In some examples, each downconverter 435 shifts the selected frequency band signal to the same intermediate frequency. For example, the downconverter 435 of the first single-band circuit 410-*a* may shift the first frequency band signal 425-*a* to the intermediate frequency. The downconverter 435 of the second single-band circuit 410-*b* may shift the second frequency band signal 425-*b* to the same intermediate frequency. As such, the downconverters 435 for each single-band circuit 410 may be configured for the individual frequency band signals the single-band circuit 410 is extracting or filtering.

In some examples, the downconverter 435 may be coupled with a single circuit component 430 and may output to single output path 445 (i.e., output circuit), as shown in FIG. 4. In some examples, the downconverter 435 may be coupled with a single circuit component 430 (e.g., single input or single input port) and be coupled with multiple output paths or multiple output lines of the same output path (e.g., multiple outputs or output ports), as described in with reference to FIG. 10. In some examples, a downconverter 435 may be coupled to multiple circuit components 430 (e.g., amplifiers or filters, or both) from multiple single-band circuits 410 (e.g., multiple inputs or multiple input ports) and be coupled with a single output path. In some examples, the downconverter 435 may be or include a mixer configured to generate a new frequency signal from two or more input signals. In other examples, the downconverter 435 may be built using various types of architecture. This present disclosure encompasses various circuits or architectures that may perform the functions of the downconverters described herein. For example, the downconverter 435 may be or include various combinations of analog components and/or digit components, such as resistors, inductors, capacitors, analog-to-digital converters, digital-to-analog converters, amplifiers, compensators, decimators, filters, power supplies, diodes, transistors, rectifiers, transformers, etc. In some examples, a downconverter 435 may be or include a dynamic downconverter such that the intermediate frequency signals output by the downconverter 435 may be changed based on one or more control signals. In some cases, the downconverter 435 may be configured to apply a phase shift to the signal received at the input of the downconverter 435.

The output path 445 may be coupled with the processing circuitry (e.g., processing circuitry 330). The output path 445 may be configured to communicate the output signal 440 to the processing circuitry. In some examples, the output path 445 may include multiple output lines as described with reference to FIG. 10. In some examples, output paths from multiple elements of the phased-array antenna may be combined before being sent to the processing circuitry. In a system with a phased-array antenna, each element of the phased-array antenna may be connected to a different instance of receiver 400. In some examples, the receiver 400 may use single-ended signaling, differential signaling, or a combination thereof. In some cases, some portions of the receiver 400 may use single-ended signaling while others use differential signaling. In some cases, the entire receiver 400 may use single-ended signaling or differential signaling.

Figure 5A:
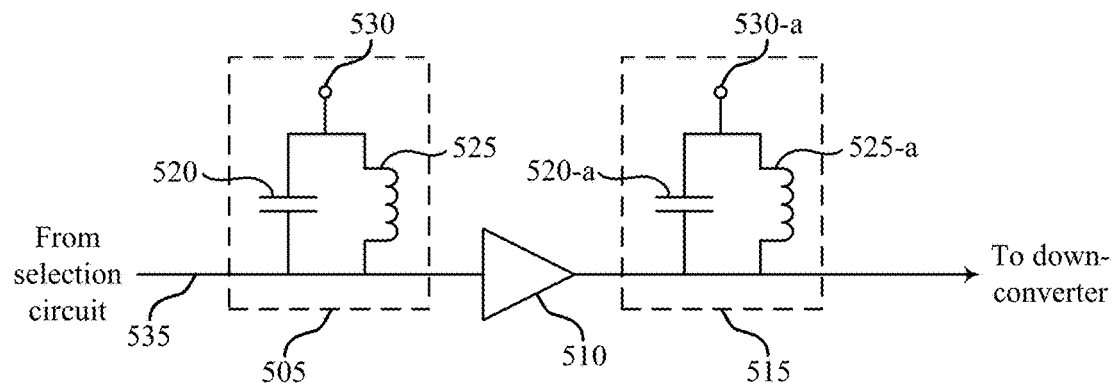
FIGS. 5A and 5B illustrate examples of circuit components that support multi-band radio-frequency reception in accordance with aspects of the present disclosure.

FIG. 5A illustrates an example of a circuit component 500 that supports multi-band radio-frequency reception in accordance with various aspects of the present disclosure. The circuit component 500 may be an example of the circuit component 430 described with reference to FIG. 4. The circuit component 500 may be a specific implementation of the circuit component 430 described more generally with reference to FIG. 4. In other examples, the circuit component 500 may include one stage or many stages. In some cases, the circuit component 500 may cooperate with the transconductance amplifier 405 or 600 to perform the functions described herein.

The circuit component 500 may be tuned to extract a specific carrier frequency band or frequency band signal 425 from the amplified wide-band radio-frequency signal 460. In effect, the circuit component 500 may be configured to filter the amplified wide-band radio-frequency signal 460 to produce the frequency band signal 425. In some examples, the components of the circuit component 500 may be optimized to perform these functions. The circuit component 500 may be formed from analog circuits, such as resistance, inductance capacitance (RLC) circuits.

The circuit component 500 may include a first tuned circuit 505, a transconductance amplifier 510, and a second tuned circuit 515. The second tuned circuit 515 may be configured similarly to the first tuned circuit 505. As such, only the first tuned circuit 505 is described here. In some cases, the first tuned circuit 505 may be referred to as a tuned load because it may serve as the load for the transconductance amplifier 405. In some cases, the second tuned circuit 515 may be referred to as a tuned load because it may serve as the load for the transconductance amplifier 510. In some cases, transconductance amplifiers may be referred to as amplifiers.

The first tuned circuit 505 may be an example of an RLC circuit including capacitor 520 and an inductor 525 coupled with a voltage source 530 and a signal line 535. The capacitance of the capacitor 520 and the inductance of the inductor 525 may be optimized to extract the frequency band signal 425 from the amplified wide-band radio-frequency signal 460. The first tuned circuit 505, the second tuned circuit 515, and the transconductance amplifier 510 cooperate to generate a better frequency band signal 425 than if only the first tuned circuit 505 were used. In some examples, the circuit component 500 may include additional stages than the two-stages illustrated. In some cases, the capacitor 520 may be an intentional capacitor or a designed capacitor. In other cases, the capacitor 520 may be a parasitic capacitance or line capacitance that exist in the circuit.

Figure 5B:
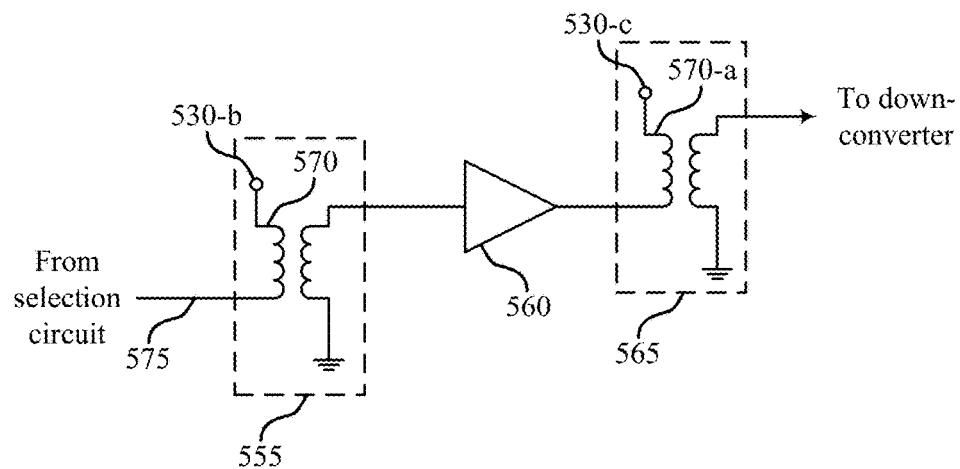

FIG. 5B illustrates an example of a circuit component 550 that supports multi-band radio-frequency reception in accordance with various aspects of the present disclosure. The circuit component 550 may be an example of the circuit component 430 described with reference to FIG. 4. The circuit component 550 may be a specific implementation of the circuit component 430 described more generally with reference to FIG. 4. In other examples, the circuit component 550 may include one stage or many stages.

The circuit component 550 is similarly embodied as the circuit component 500, except the components of the first tuned circuit 555 and the second tuned circuit 565 include transformers 570. The transformers 570 may be coupled with the voltage source 530, ground or virtual ground, and a signal line 575. The transformers 570 may be configured to filter the amplified wide-band radio-frequency signal 460 and extract the selected frequency band signal 425. The second tuned circuit 565 may include two signal lines, and as such downconverters 435 may be configured with input ports to accept two signal lines from the circuit component 550. A transconductance amplifier 560 may be positioned between the two tuned circuit stages 555, 565. In some examples, the two outputs may be coupled with each other to form a single output. In other examples, the transconductance amplifier 560 may include one output based on the amplifier architecture. In yet other examples, the transconductance amplifier 560 may include a plurality of outputs based on the amplifier architecture, which outputs may not be coupled with each other. In some cases, the transformer 570 may act as a balun that converts a single-ended input into a differential output, or vice-versa. In some cases, the first tuned circuit 555 may be referred to as a tuned load because it may serve as the load for the transconductance amplifier 405. In some cases, the second tuned circuit 565 may be referred to as a tuned load because it may serve as the load for the transconductance amplifier 560.

In some cases, the first tuned circuit 555 may include a capacitor. In some examples, the capacitor of the first tuned circuit 555 may be coupled with the voltage source 530-$b$ and the transformer 570. In some examples, the capacitor of the first tuned circuit 555 may be coupled with a top terminal of a secondary coil of the transformer 570 and ground. In some examples, the capacitor of the first tuned circuit 555 may be coupled with the top terminal of the secondary coil of the transformer 570 and an input of the amplifier 560.

In some cases, the second tuned circuit 565 may include a capacitor. In some examples, the capacitor of the second tuned circuit 565 may be coupled with an output of the amplifier 560 and the voltage source 530-$c$. In some examples, the capacitor of the second tuned circuit 565 may be coupled with a top terminal of a secondary coil of the transformer 570-$a$ and ground. In some examples, the capacitor of the second tuned circuit 565 may be coupled with the top terminal of the secondary coil of the transformer 570-$a$ and an input of the downconverter.

FIGS. 5A and 5B illustrate two examples of circuit components that may be used in the receiver design. In other cases, however, tuned circuits 505, 515, 555, 565 may be built having different architectures than the architectures illustrated in line with the present disclosure. This disclosure encompasses various circuits or architectures that may perform the functions of the circuit components described herein. For example, the tuned circuits 505, 515, 555, 565 may be or include various combinations of analog components and/or digit components, such as resistors, inductors, capacitors, analog-to-digital converters, digital-to-analog converters, amplifiers, compensators, decimators, filters, power supplies, diodes, transistors, rectifiers, transformers, etc.

Figure 6:
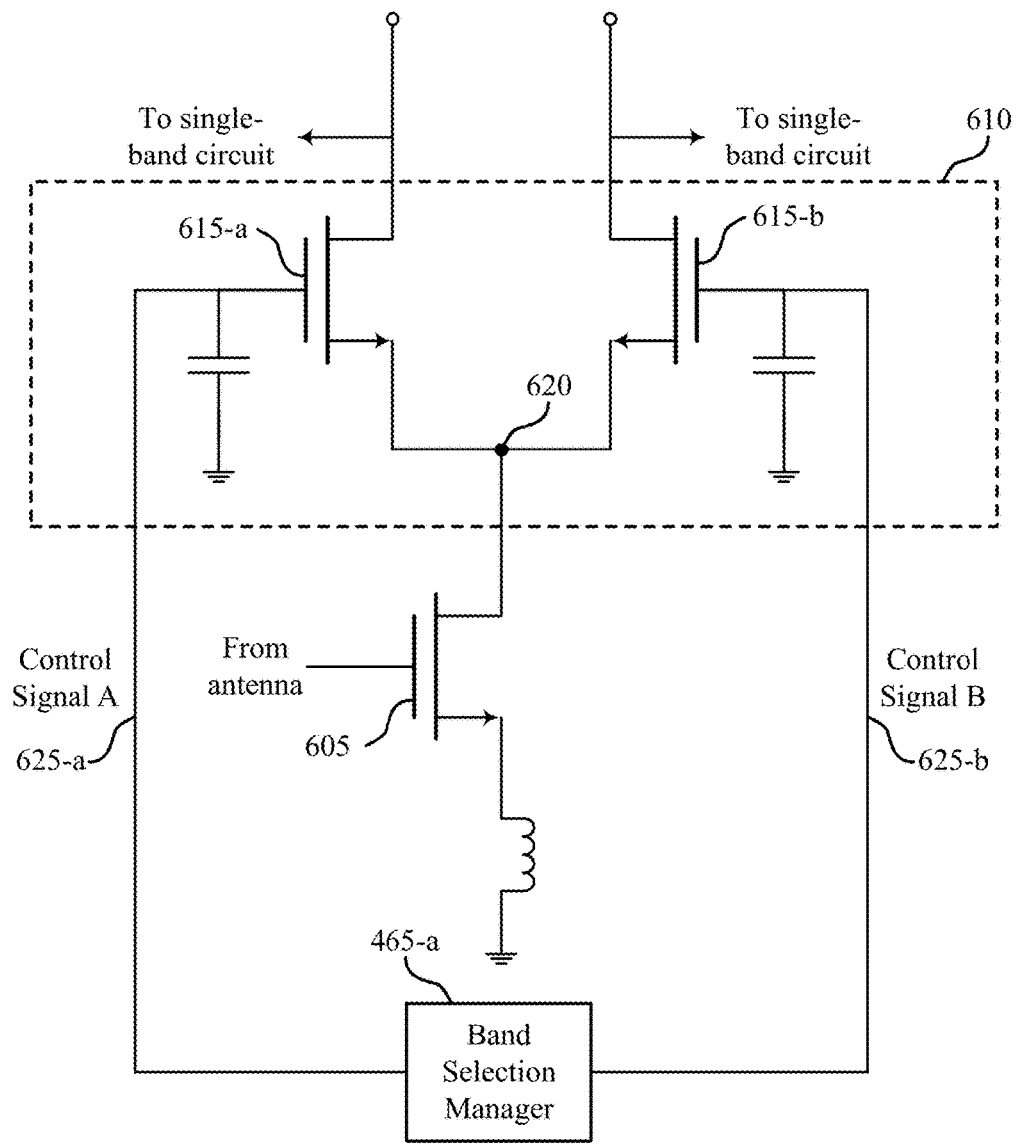
FIG. 6 illustrates an example of a transconductance amplifier that supports multi-band radio-frequency reception in accordance with aspects of the present disclosure.

FIG. 6 illustrates an example of a transconductance amplifier 600 that supports multi-band radio-frequency reception in accordance with various aspects of the present disclosure. The transconductance amplifier 600 may be an example of the transconductance amplifier 405 described with reference to FIG. 4. The transconductance amplifier 600 may be an example of a cascode circuit that is configured to select different output lines.

The transconductance amplifier 600 may include a transconductor 605 and selection circuitry 610. The selection circuitry 610 may include a plurality of cascode transistors 615. In the illustrative example, the transconductance amplifier 600 may be coupled with two single-band circuits. The number of cascode transistors 615 in the selection circuitry 610 may be based on the number of single-band circuits that are coupled with the transconductance amplifier 600. In some examples, there is at least one cascode transistor 615 for every single-band circuit. The transconductance amplifier 600 may be coupled to any number of single-band circuits. A single-band circuit may be configured to amplify and/or extract signals of a single-band. In some examples, the single-band circuit may be an example of an amplifier configured for a single-band, and may have filtering properties. In some examples, the single-band circuit may be an example of a filter configured for a single band. For example, the transconductance amplifier 600 may be modified to couple with three single-band circuits as shown in FIG. 4. The transconductance amplifier 600 may be configured to convert a voltage signal input at the gate of the transconductor 605 into a current signal.

The transconductor 605 and the cascode transistors 615 may be examples of transistors or other switches. The transconductor 605 may be configured to generate an amplified wide-band signal based on receiving the wide-band signal from the antenna at the gate of the transconductor 605. In some cases, the transconductor 605 may be an example of a low-noise amplifier comprising a transistor and an inductor. The wide-band signal may be fed to the gate of the transconductor 605. An amplified version of the wide-band signal may be output at the drain of the transconductor 605.

The plurality of cascode transistors 615 may be configured to selective couple single band circuits with the transconductor 605 and/or the antenna based on a voltage applied to a gate of the cascode transistors 615. A controller, such as a band selection manager 465-a may selectively apply voltages to the gates of one or more of the cascode transistors 615 to route the amplified wide-band signal to the single-band circuits 410. For example, the band selection manager 465-a may generate a first control signal 625-a to apply to the gate of the first cascode transistor 615-a and a second control signal 625-b to apply to the gate of the second cascode transistor 615-b. The control signals 625-a and 625-b may be independently generated, thereby providing independent control of the cascode transistors 615. The voltages generated by the band selection manager 465-a may be analog bias voltages that may be applied to the gates of the cascode transistors 615. In some cases, the bias voltage applied to the first cascode transistor 615-a may be different than the bias voltage applied to the second cascode transistor 615-b. In some cases, the bias voltages generated by the band selection manager 465-a may be the same or the bias voltages may be different. The number of control signals 625 generated by the band selection manager 465-a may be based on the number of cascode transistors 615 in the selection circuitry 610. In some examples, there is at least one control signal 625 for every cascode transistor 615. The transconductor 605 and a selected cascode transistor 615 may be an example of a cascode amplifier. The transconductance amplifier 600 may also include other electrical components to perform the functions described herein.

The transconductor 605 may be configured to receive the wide-band radio-frequency signal from the antenna (e.g., element of the phased-array antenna). The transconductor 605 may be an example of an amplifier or a low-noise amplifier. The cascode transistors 615 may be configured to couple a single-band-selection circuit with the antenna through the transconductor 605.

A transceiver controller may control which cascode transistors 615 are activated. The transceiver controller may apply a voltage to one of the gates of the cascode transistors 615. When the voltage is applied, the selected cascode transistor 615-a may be activated coupling the transconductor 605 to one of the single-band circuits. By activating the transconductor 605 and one of the cascode transistors 615, the transconductance amplifier 600 forms a cascode amplifier coupling the antenna with one of the single-band circuits. The combination of the transconductor 605, which acts as a low-noise amplifier, and an activated cascode transistor 615 may be configured to impedance match with the antenna circuit, generate the amplified wide-band radio-frequency signal 460 based on receiving the wide-band radio-frequency signal 415 at the gate of the transconductor 605, and select which single-band circuit(s) 410 the amplified wide-band radio-frequency signal 460 is sent. For example, the input impedance of the transconductance amplifier 600 may be matched to the output impedance of the antenna.

In some examples, the transceiver controller may activate multiple cascode transistors 615 simultaneously, thereby coupling the antenna with multiple single-band circuits. In some examples, the transceiver controller may activate any combination of cascode transistors simultaneously. The transceiver controller may be an example of a processor in a receiving entity (e.g., UE 210) of the wireless communications system 200.

FIG. 6 illustrates an example of a transconductance amplifier 600 that may be used in the receiver design. In other cases, however, selection circuits may be or include different architectures than the ones shown. This disclosure encompasses various circuits or architectures that may perform the functions of the selection circuits described herein. For example, the transconductance amplifier 600 may be or include various combinations of analog components and/or digit components, such as resistors, inductors, capacitors, analog-to-digital converters, digital-to-analog converters, amplifiers, compensators, decimators, filters, power supplies, diodes, transistors, rectifiers, transformers, etc.

Figure 7:
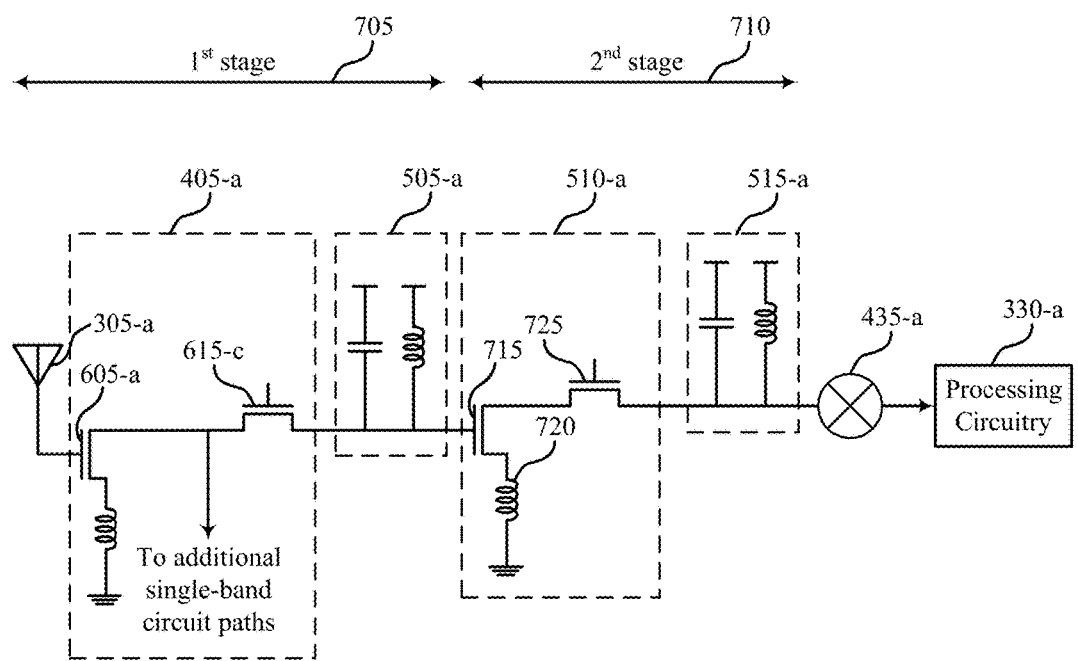
FIG. 7 illustrates an example of a circuit that supports multi-band radio-frequency reception in accordance with aspects of the present disclosure.

FIG. 7 illustrates an example of a circuit 700 that supports multi-band radio-frequency reception in accordance with various aspects of the present disclosure. The circuit 700 shows a single-band circuit from the antenna 305-a to the processing circuitry 330-a. The circuit 700 may include a first stage 705 and a second stage 710.

The first stage 705 may, in some examples, include the transconductance amplifier 405-a and the first tuned circuit 505-a. A wide-band radio frequency (RF) signal may be received by the antenna 305-a and may be amplified by the transconductor 605-a (e.g., the low-noise amplifier) of the transconductance amplifier 405-a. The controller may activate the appropriate cascode transistor 615-c, thereby forming a cascode. The first tuned circuit 505-a may extract a single-band signal from the wide-band radio-frequency signal. In some cases, the circuit 700 may only include the first stage 705. In such cases, the output of the first tuned circuit 505-a may be coupled with the input of the downconverter 435-a. In some cases, the first tuned circuit 505-a may be an example of the tuned circuit 555 described with reference to FIG. 5.

The second stage 710 may, in some examples, include the transconductance amplifier 510-a and the second tuned circuit 515-a. In some cases, the transconductance amplifier 510-a may be an example of a cascode amplifier. For example, the amplifier may include a transconductor 715 and an inductor 720 that cooperate to form a low-noise amplifier and a cascode transistor 725 that forms the second stage of the cascode amplifier. The second tuned circuit 515-a may extract the single-band signal from the amplified signal output from the first tuned circuit 505-a and the transconductance amplifier 510-a.

The circuit 700 shows single-ended components and a single-ended signal being communicated throughout the circuit 700. In some cases, any portion or all portions of the circuit 700 may be configured to communicate using differential signals. In such cases, baluns may be included in the circuit 700 to convert between single-ended signals and differential signals, where appropriate. For example, in some cases, the downconverter 435-a may include a single-ended input and a differential output. In such cases, the downconverter 435-*a* may include a balun.

Figure 8:
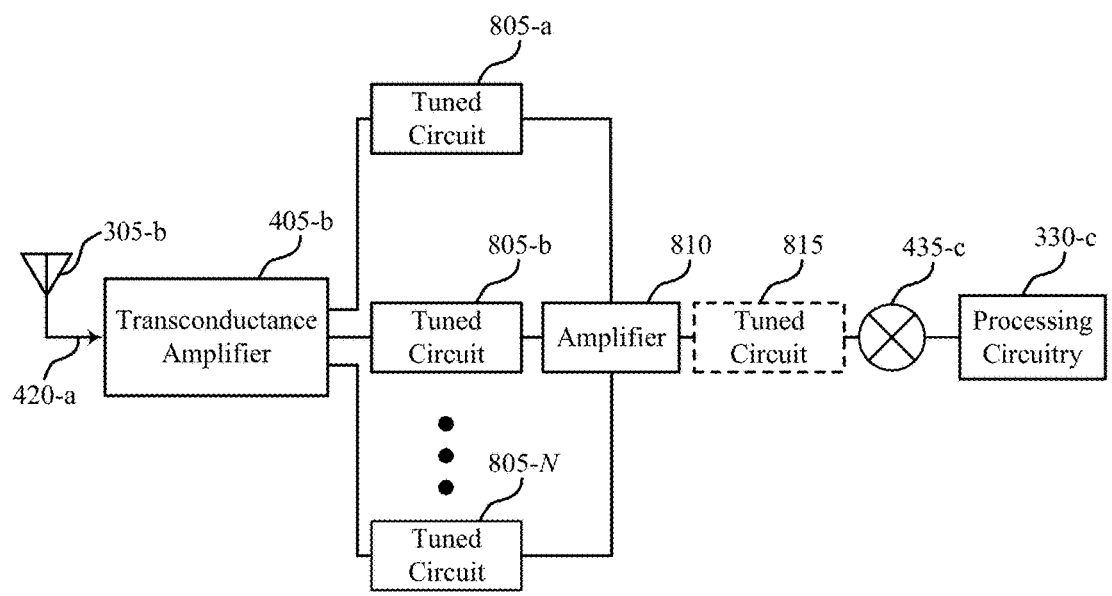
FIG. 8 illustrates an example of a receiver that supports multi-band radio-frequency reception in accordance with aspects of the present disclosure.

FIG. 8 illustrates an example of a receiver 800 that supports multi-band radio-frequency reception in accordance with various aspects of the present disclosure. The receiver 800 may illustrate an alternative embodiment to the receiver 400 described with reference to FIG. 4.

The receiver 800 may be coupled with an antenna 305-*b* (which may be an element of a phased-array antenna). The receiver 800 may receive a wide-band RF signal from the antenna 305-*b* and generate an amplified wide-band RF signal using the transconductance amplifier 405-*b*. The transconductance amplifier 405-*b* may be an example of the transconductance amplifiers 405, 600 described with reference to FIGS. 4 and 6. The amplified wide-band signal may be sent to one or more single-band paths that include a tuned circuit 805 that extracts a narrow-band signal from the wide-band signal.

In the receiver 800, the outputs of the tuned circuit 805 of each single-band path may be combined at the transconductance amplifier 810 into a single output of the transconductance amplifier 810. In this example, along with others, there may be some differences between the receiver 800 and the receiver 400. For example, the transconductance amplifier 810 may include signals paths that are linked together at some point within the transconductance amplifier 810. In another example, an optional tuned circuit 815 may be tuned to process an intermediate-band signal. Because there may be one tuned circuit 815 for a plurality of different narrow-band signals, the tuned circuit 815 may be designed to have a different frequency width than the tuned circuit 805. The width of the tuned circuit 815 may be wide enough to capture each narrow-band signal that is generated by one of the tuned circuits 805 and more narrow than the wide-band RF signal received by the transconductance amplifier 405-*b*. After being processed by the tuned circuit 815, the signals may be processed by a downconverter 435-*c* and then on to processing circuitry 330-*c*. In some cases, the first tuned circuit 805 may be referred to as a tuned load because it may serve as the load for the transconductance amplifier 405-*b*. In some cases, the second tuned circuit 815 may be referred to as a tuned load because it may serve as the load for the transconductance amplifier 810.

The receiver 800 shows single-ended components and a single-ended signal being communicated through the receiver 800. In some cases, any portion or all portions of the receiver 800 may be configured to communicate using differential signals. In such cases, baluns may be included in the receiver 800 to convert between single-ended signals and differential signals. For example, in some cases, the downconverter 435-*b* may include a single-ended input and a differential output. In such cases, the downconverter 435-*b* may include a balun.

Figure 9A:
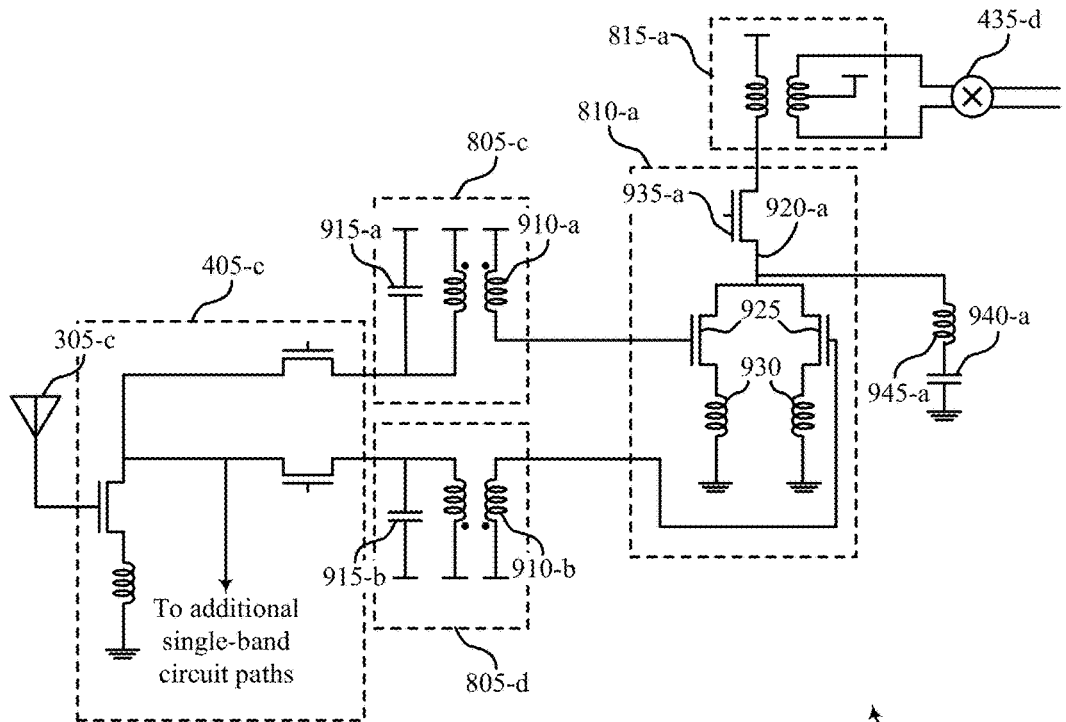
FIGS. 9A and 9B illustrate examples of circuits that support multi-band radio-frequency reception in accordance with aspects of the present disclosure.

FIG. 9A illustrates an example of a circuit 900 that supports multi-band radio-frequency reception in accordance with various aspects of the present disclosure. The circuit 900 illustrates an embodiment of a single-band path of the receiver 800 described with reference to FIG. 8. The circuit 900 shows how components may be configured when the transconductance amplifier 810 is used to combine signals.

The circuit 900 includes an antenna 305-*c* for receiving a wide-band RF signal, a transconductance amplifier 405-*c* for amplifying and directing the wide-band RF signal to the selected single-band paths, a first tuned circuit 805-*c* for a first single-band path and a second tuned circuit 805-*d* for a second single-band path, a transconductance amplifier 810-*a*, a tuned circuit 815-*a*, and a downconverter 435-*d*. Many of the components of the circuit 900 are described in more detail in other portions of the present disclosure and, as such, a full description of all of the components of the circuit 900 is not repeated here.

The tuned circuits 805-*c* and 805-*d* may use a transformer 910 (e.g., transformer 910-*a*, transformer 910-*b*) to extract the narrow-band signal from the wide-band signal. In some cases, the tuned circuits 805-*c* and 805-*d* may include a capacitor 915 (e.g., capacitor 915-*a*, capacitor 915-*b*). In some cases, the capacitor 915 may represent one or more parasitic capacitances that are present in the circuit 900.

The transconductance amplifier 810-*a* may be configured to amplify the narrow-band signals received from the tuned circuits 805-*c* and may be configured to combine the signals from multiple single-band paths into a unified path 920. The amplifier may include a plurality of transconductors 925 and inductors 930 that cooperate to amplify the narrow-band signal of each single-band path. The transconductor 925 and inductor 930 may be an example of a low-noise amplifier. The transconductance amplifier 810-*a* may include a low-noise amplifier for each single-band path. The outputs of each transconductor 925 may be tied together to form the unified path 920. The transconductance amplifier 810-*a* may also include a cascode transistor 935. With the cascode transistor 935, the transconductance amplifier 810-*a* may be an example of a cascode amplifier.

The circuit 900 may include a capacitor 940 and an inductor 945 coupled with the unified path 920. The capacitor 940 and the inductor 945 may couple to the unified path 920 between the transconductors 925 and the cascode transistor 935. In some cases, The capacitor 940 and the inductor 945 may couple to the unified path 920 after the cascode transistor 935.

The circuit 900 may also include a tuned circuit 815-*a* that converts a single-ended signal on the unified path 920-*a* into a differential signal. In some cases, the tuned circuit 815-*a* may be an example of a balun. The illustrated tuned circuit 815-*a* may be an example of an transformer-type balun, but other types of baluns are also contemplated as alternatives in line with this disclosure. After the downconverter 435-*d* with a differential input and a differential output may be configured to shift the narrow-band signals to a different signal. The different signal may then be output to the processing circuitry (not shown). FIG. 9A illustrates a circuit 900 that includes two single-band circuits, but, in some cases, there may be more than two single-band circuits in the circuit 900. In such cases, circuit 900 may include additional components such as additional tuned circuits 805, additional transconductors 925, and/or additional inductors 930. In some cases, the bandwidth of the tuned circuit 815-*a* may be larger than a bandwidth of tuned circuits 805-*c* or 805-*d*. The bandwidth of the tuned circuit 815-*a* may be large enough to span the bands passed by tuned circuits 805-*c* and 805-*d*.

Figure 9B:
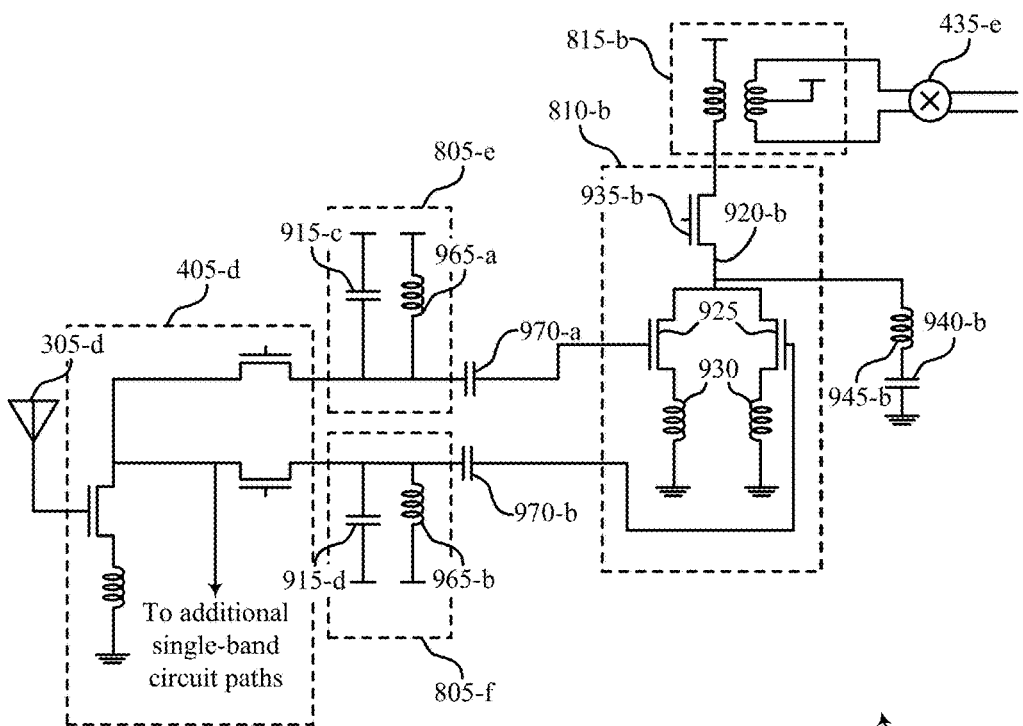

FIG. 9B illustrates an example of a circuit 960 that supports multi-band radio-frequency reception in accordance with various aspects of the present disclosure. The circuit 960 illustrates an embodiment of a single-band path of the receiver 800 described with reference to FIG. 8. The circuit 960 shows how components may be configured when the transconductance amplifier 810 is used to combine signals.

The circuit 960 includes an antenna 305-*d* for receiving a wide-band RF signal, a transconductance amplifier 405-*d* for amplifying and directing the wide-band RF signal to the selected single-band paths, a first tuned circuit 805-*e* for a first single-band path and a second tuned circuit 805-*f* for a second single-band path, a transconductance amplifier 810-b, a tuned circuit 815-b for a unified path 920, and a downconverter 435-d. Many of the components of the circuit 960 are described in more detail in other portions of the present disclosure including with reference to circuit 900 and FIG. 9A, and, as such, a full description of all of the components of the circuit 900 is not repeated here.

The tuned circuits 805-e and 805-f may, in some examples, use a capacitor-inductor pair (e.g., capacitors 915-c, 915-d and inductors 965-a, 965-b, pair 915-c and 965-a, pair 915-d and 965-b) to extract the narrow-band signal from the wide-band signal. In some cases, the tuned circuits 805-e and 805-f may include the capacitor 915 (e.g., capacitor 915-c or 915-d). In some cases, the capacitor 915 (e.g., capacitor 915-c or 915-d) may represent parasitic capacitances that are present in the circuit 960.

The tuned circuits 805-e and 805-f may also include a coupling capacitor 970 (e.g., coupling capacitor 970-a, coupling capacitor 970-b). The coupling capacitor 970 may be configured to filter out low-frequency voltages and allow high-frequency voltages to pass through. In alternative designs, if the low-frequency voltages (e.g., DC voltage) are seen by the gate of the transconductors 925, the transconductors 925 may be biased at the wrong place. FIG. 9B illustrates a circuit 960 that includes two single-band circuits, but, in some cases, there may be more than two single-band circuits in the circuit 960. In such cases, circuit 960 may include additional components such as additional tuned circuits 805, additional transconductors 925, and/or additional inductors 930. In some cases, the bandwidth of the tuned circuit 815-b may be larger than a bandwidth of tuned circuits 805-e or 805-f. The bandwidth of the tuned circuit 815-b may be large enough to span the bands passed by tuned circuits 805-e and 805-f.

Figure 10:
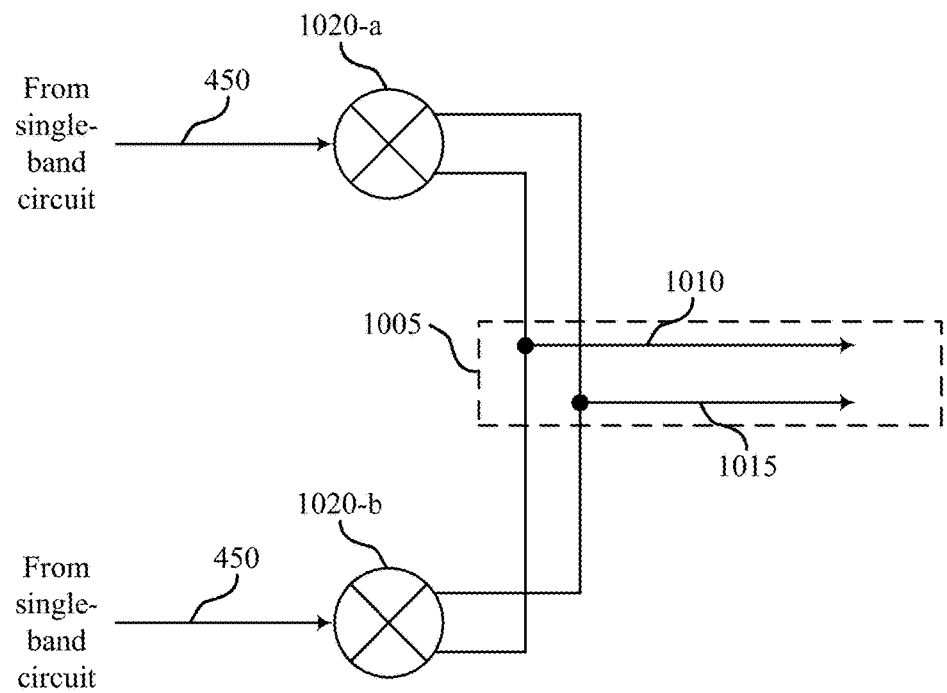
FIG. 10 illustrates an example of an output circuit that supports multi-band radio-frequency reception in accordance with aspects of the present disclosure.

FIG. 10 illustrates an example of an output circuit 1000 that supports multi-band radio-frequency reception in accordance with various aspects of the present disclosure. The output circuit 1000 may be configured to couple the single-band circuits 410 with the processing circuitry 330. The output circuit 1000 may include an output path 1005. The output path 1005 may be an example of the output path 445 described with reference to FIG. 4. The terms output circuit and output path may at times be used interchangeably.

The output circuit 1000 may be configured to receive frequency band signals 425 from multiple single-band circuits 410, translate the frequency band signals 425 into an intermediate-band frequency (e.g., the output signal 440), combine signals from two or more single-band circuits 410 (in some cases), and send the resulting signal to the processing circuitry 330. The output circuit 1000 illustrates a downconverter 1020 that includes a single-ended input that receives a single-ended signal and includes a differential output that outputs a differential signal that includes at least two signals. The downconverter 1020 may be an example of the downconverter 435 described with reference to FIG. 4. In some cases, the downconverter 1020 may include a balun to convert a single-ended signal into a pair of differential signals.

The output path 1005 may be optimized in a variety of different ways. For example, the output path 1005 may be optimized to minimize area occupied by a circuit. Such output paths 1005 may include a single signal line and may carry a single-ended signal to the processing circuitry 330. In other examples, the output path 1005 may be optimized to minimize current used during operation of the processing circuitry 330. Such output paths 1005 may include multiple signal lines (e.g., a first signal line 1010 and a second signal line 1015). Each signal line 1010, 1015 may be configured to carry one signal of a differential pair of signals. To accommodate multiple signals lines that are part of the same output path 1005, downconverters 1020 may include an output port that couples to multiple output lines. For example, the downconverter 1020-a may include a first output port coupled to first signal line 1010 and a second output port coupled to the second signal line 1015. In such examples, the downconverter 1020-a may communicate different output signals along the different signal lines 1010, 1015. In some examples, the first signal line 1010 communicates a first portion of the output signal 440 and the second signal line 1015 communicates a second portion of the output signal 440. An output path 1005 may include any number of output lines. In some cases, the signal line 1010 may be coupled with a first differential output port of each downconverter 1020 and the signal line 1015 may be coupled with a second differential output port of each downconverter 1020.

In some examples, the output circuit 1000 may include multiple output paths 1005. An output path 1005 may refer to a circuit that communicates an output signal having a particular center frequency or a set of highly-related center frequencies (e.g., an output path 1005 with multiple lines). In some examples, the output circuit 1000 may include a first output path for a first output signal having a first center frequency and a second output path for a second output signal having a second center frequency different from first center frequency. To support two distinct output paths 1005, each single-band circuit 410 may include multiple downconverters, one downconverter per output path. In some examples, there is a correlation between output paths 1005 and downconverters 1020.

Figure 11:
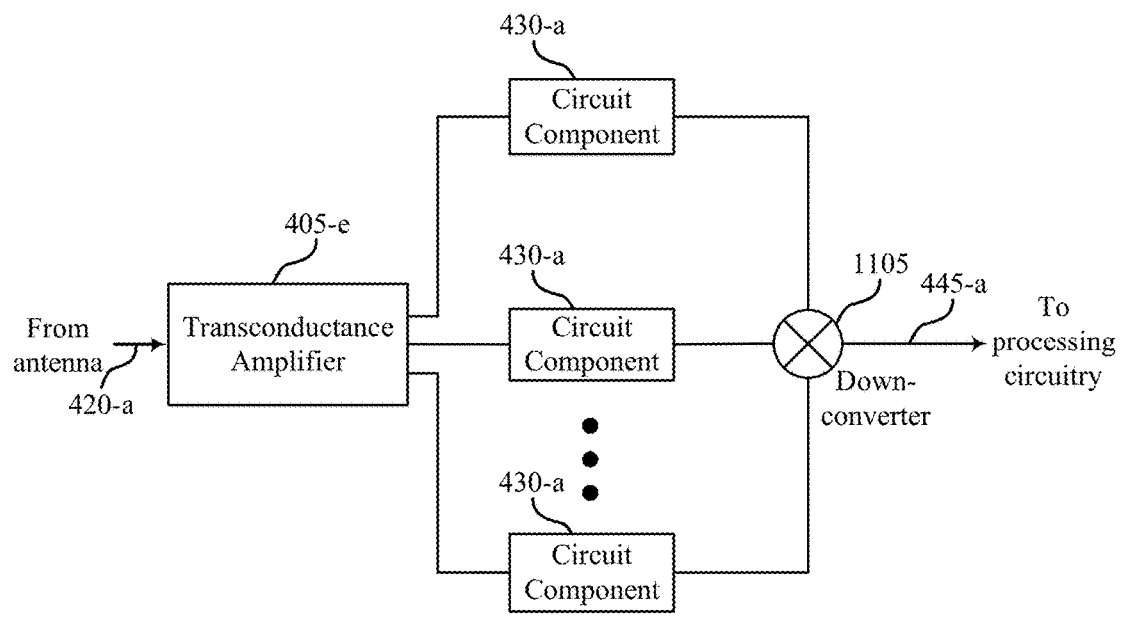
FIG. 11 illustrates an example of a circuit that supports multi-band radio-frequency reception in accordance with aspects of the present disclosure.

FIG. 11 illustrates an example of a receiver 1100 that supports multi-band radio-frequency reception in accordance with various aspects of the present disclosure. The receiver 1100 includes a single downconverter 1105 instead of a downconverter for each single-band circuit 410 as shown and described in FIG. 4.

The downconverter 1105 may include an input port configured to couple with multiple inputs (single-band circuits 410) and a single output port coupled with an output path 445-a. In some examples, the downconverter 1105 may be used to couple an output path 445-a having a single signal line.

The downconverter 1105 may be configured to downconvert different frequency band signals 425 to a common intermediate frequency. In effect, the downconverter 1105 may be configured to generate an output signal 440 with a first center frequency from multiple different frequency band signals 425 having multiple different center frequencies. For example, the downconverter 1105 may be configured to generate the output signal 440 from the first selected frequency band signal 425-a and to generate the output signal 440 from the second selected frequency band signal 425-b.

Figure 12:
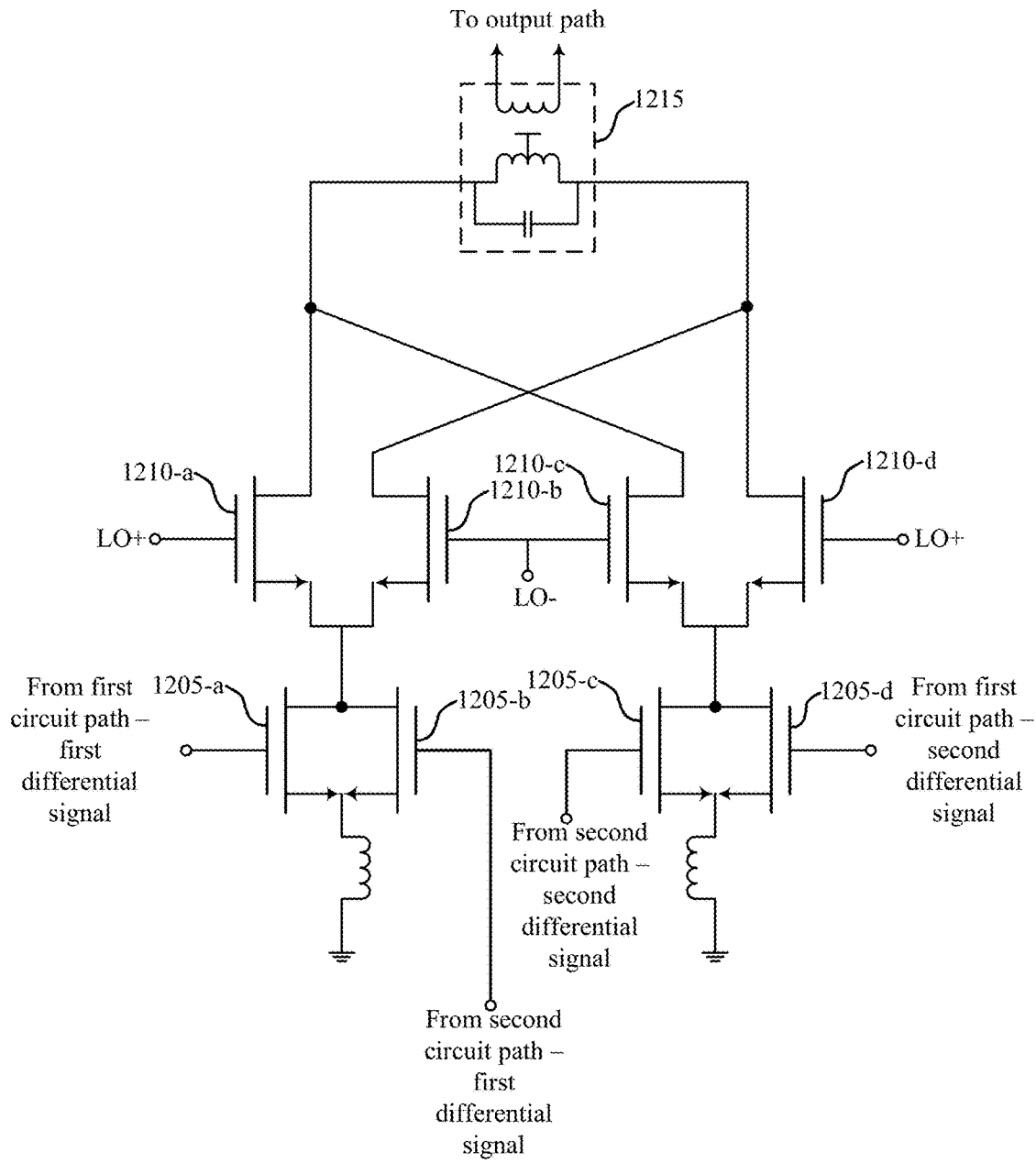
FIG. 12 illustrates an example of a downconverter that supports multi-band radio-frequency reception in accordance with aspects of the present disclosure.

FIG. 12 illustrates an example of a downconverter 1200 that supports multi-band radio-frequency reception in accordance with various aspects of the present disclosure. The downconverter 1200 may be a specific implementation of the downconverter 1105 described with reference to FIG. 11. As such, the downconverter 1200 may be an example of the downconverter 1105 described with reference to FIG. 11.

The downconverter 1200 receives signals from multiple single-band circuits 410 associated with the same element of a phased-array antenna. The illustrated downconverter 1200 is coupled with two single-band circuits 410. In other examples, the downconverter 1200 may be coupled with any number of single-band circuits 410. In such examples, the downconverter 1200 may be modified to couple with the any number of single-band circuits 410. For example, the downconverter 1200 may be modified to couple with three single-band circuits as shown in FIG. 4. The downconverter 1200 generates an output signal 440 by shifting the received signals to an intermediate frequency.

The downconverter 1200 a plurality of transconductors 1205 and plurality of mixing transistors 1210. The downconverter 1200 may have a differential input and a differential output. A local oscillator may be applied to the mixing transistors 1210. For example, a plus signal (e.g., LO+) of the local oscillator may be tied to the gates of mixing transistors 1210-*a* and 1210-*d* and a minus signal (e.g., LO−) of the local oscillator may be tied to the gates of the mixing transistors 1210-*b* and 1210-*c*. Outputs of the mixing transistors 1210 may be cross-coupled prior to being output by the output components 1215. The downconverter may also include other components such as capacitors, inductors, transformers, etc.

FIG. 12 illustrates an example of a downconverter 1200 that may be used in the receiver design. In other cases, however, downconverters may be or include different architectures than the ones shown. This disclosure encompasses various circuits or architectures that may perform the functions of the downconverters described herein. For example, the downconverter 1200 may be or include various combinations of analog components and/or digit components, such as resistors, inductors, capacitors, analog-to-digital converters, digital-to-analog converters, amplifiers, compensators, decimators, filters, power supplies, diodes, transistors, rectifiers, transformers, etc.

Figure 13:
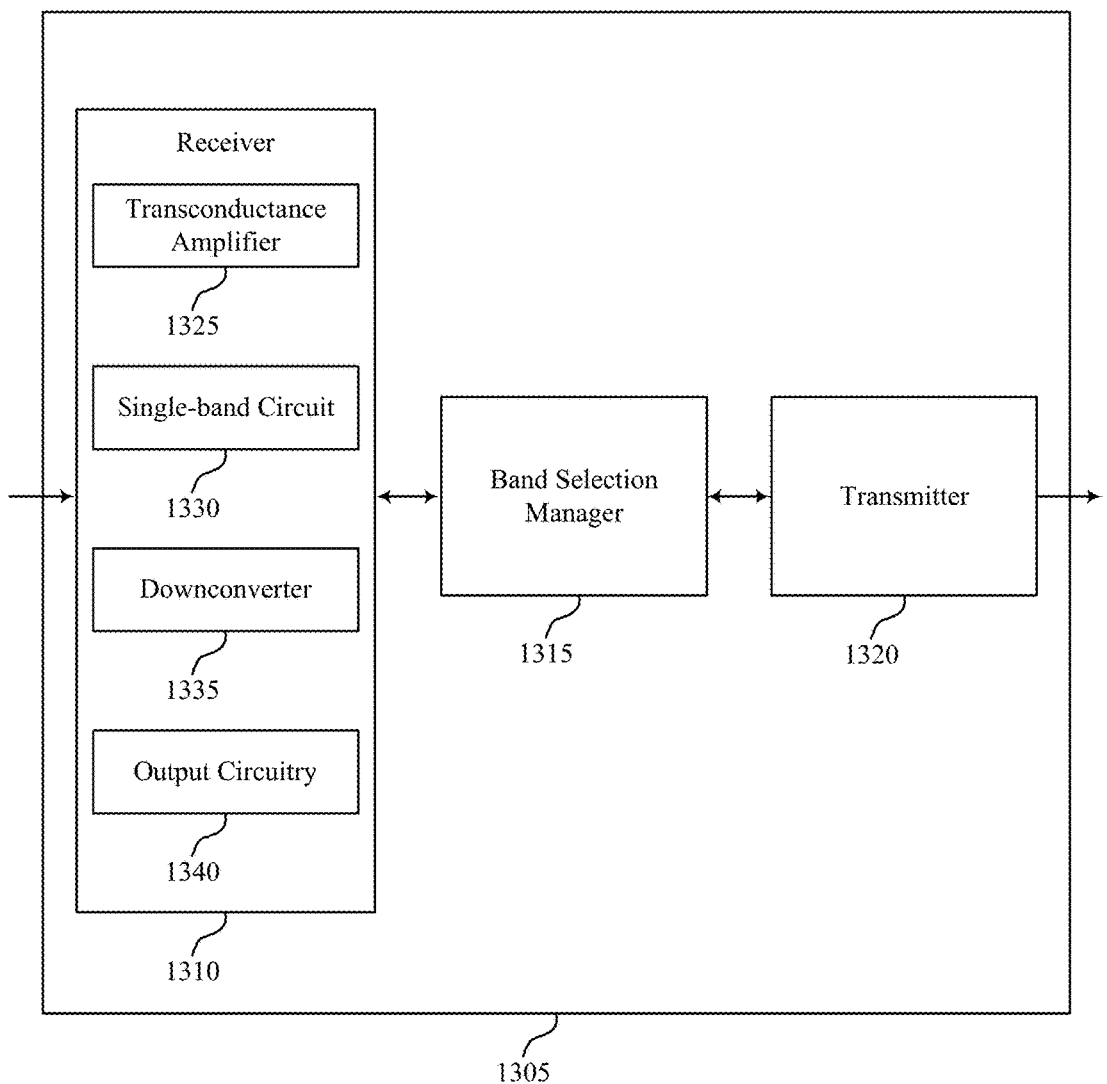
FIG. 13 shows a block diagram of a device that supports multi-band radio-frequency reception in accordance with aspects of the present disclosure.

FIG. 13 shows a block diagram 1300 of a wireless device 1305 that supports multi-band radio-frequency reception in accordance with aspects of the present disclosure. Wireless device 1305 may be an example of aspects of a UE 115 as described with reference to FIG. 1. Wireless device 1305 may include receiver 1310, band selection manager 1315, and transmitter 1320. Wireless device 1305 may also include a processor. Each of these components may be in communication with one another (e.g., via one or more buses).

Receiver 1310 may receive information such as packets, user data, or control information associated with various information channels (e.g., control channels, data channels, and information related to multi-band radio-frequency reception, etc.). Information may be passed on to other components of the device. The receiver 1310 may be an example of aspects of the transceiver 1435 described with reference to FIG. 14. The receiver 1310 may utilize a single antenna or a set of antennas.

Receiver 1310 may receive a wide-band radio-frequency signal from an antenna and receive a set of wide-band radio-frequency signals from a set of elements of a phased-array antenna, where the antenna is one of the set of elements of the phased-array antenna. The receiver 1310 may also include a transconductance amplifier 1325, single-band circuit 1330, downconverter 1335, and output circuitry 1340. In some cases, the wide-band radio-frequency signal may be a wide-band millimeter-wave signal.

Transconductance amplifier 1325 may be configured to generate an amplified wide-band radio-frequency signal based on a wide-band radio-frequency signal received from the antenna or antenna element. The transconductance amplifier 1325 may be also configured to select a single-band circuit and send the amplified wide-band radio-frequency signal to the selected single-band circuit. In some cases, the transconductance amplifier 1325 may include a transconductor and selection circuitry, which includes a plurality of cascode transistors. A controller may select the single-band circuit by activating the cascode transistor associated with the selected single-band circuit. In some cases, the amplified wide-band radio-frequency signal may be an amplified wide-band millimeter-wave signal.

Transconductance amplifier 1325 may generate an amplified wide-band radio-frequency signal based on receiving the wide-band radio-frequency signal from the antenna. The transconductance amplifier 1325 may select a single-band circuit from a set of single-band circuits based on generating the amplified wide-band radio-frequency signal, apply a voltage to a specific switching component of a set of switching components of a transconductance amplifier 1325, where selecting the single-band circuit is based on applying the voltage to the specific switching component, select a single-band extraction circuit from a set of single-band extraction circuits based on control information of the wide-band radio-frequency signal, and apply a voltage to a specific switching component of a set of switching components of a selection component, where selecting the single-band extraction circuit is based on applying the voltage to the specific switching component. In some cases, selecting the single-band circuit includes: selecting multiple single-band circuits from the set of single-band circuits to receive the wide-band radio-frequency signal simultaneously. In some cases, selecting the single-band extraction circuit includes: selecting multiple single-band extraction circuits from the set of single-band extraction circuits to receive the wide-band radio-frequency signal simultaneously.

Single-band circuit 1330 may be configured to extract a selected frequency band signal from an amplified wide-band radio-frequency signal received from the transconductance amplifier. In some cases, the single-band circuit 1330 may include one or more tuned circuits that extract the selected frequency band signal and one or more transconductance amplifiers. In some cases, the selected frequency band signal may be a selected frequency band of a millimeter-wave signal.

Single-band circuit 1330 may extract a selected frequency band signal having a first center frequency from the amplified wide-band radio-frequency signal based on the selected single-band circuit 1330 and extract a second selected frequency band signal from the amplified wide-band radio-frequency signal based on selecting multiple single-band circuits 1330, the second selected frequency band signal having a third center frequency different from the center frequency. Single-band circuit 1330 may extract a selected frequency band signal having a first center frequency from the wide-band radio-frequency signal based on the selected single-band circuit 1330, filter the wide-band radio-frequency signal based on a characteristic of the selected single-band circuit 1330, extract a second selected frequency band signal from the wide-band radio-frequency signal based on selecting multiple single-band circuits 1330, the second selected frequency band signal having a third center frequency different from the center frequency, extract a single-band signal having a first center frequency from the wide-band radio-frequency signal based on the selected single-band extraction circuit, filter the wide-band radio-frequency signal based on a characteristic of the selected single-band extraction circuit, and extract a second single-band signal from the wide-band radio-frequency signal based on selecting multiple single-band extraction circuits, the second single-band signal having a third center frequency different from the center frequency.

Downconverter 1335 may be configured to shift center frequency a selected frequency band signal received from a single-band circuit to a new center frequency. The new center frequency may be selected or configured based on a desired frequency of the processing circuitry. In some cases, the downconverter 1335 may be an example of a mixer.

Downconverter 1335 may downconvert the selected frequency band signal to an output signal having a second center frequency different from the first center frequency and convert the single-band signal to an output signal having a second center frequency different from the first center frequency.

Output circuitry 1340 may be configured to couple the single-band circuits with the processing circuitry. The output circuitry 1340 may include an output path. In some cases, the output circuitry 1340 may include the downconverter. The output circuitry 1340 may be configured to receive frequency band signals from multiple single-band circuits, combine signals from two or more single-band circuits, and send the resulting signal to the processing circuitry.

Output circuitry 1340 may combine output signals received from the set of elements of the phased-array antenna, convey the output signal on an output path common to the set of single-band extraction circuits, combine output signals received from the set of elements of the phased-array antenna, where conveying the output signal is based on combining the output signals, and convey a second portion of the output signal on a second output line of the output path. In some cases, conveying the output signal on the output path includes: conveying a first portion of the output signal on a first output line of the output path.

Band selection manager 1315 may be an example of aspects of the band selection manager 465 and/or the band selection manager 1415 described with reference to FIGS. 4, 6, and 14. Band selection manager 1315 and/or at least some of its various sub-components may be implemented in hardware, software executed by a processor, firmware, or any combination thereof. If implemented in software executed by a processor, the functions of the band selection manager 1315 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The band selection manager 1315 and/or at least some of its various sub-components may be physically located at various positions, including being distributed such that portions of functions are implemented at different physical locations by one or more physical devices. In some examples, band selection manager 1315 and/or at least some of its various sub-components may be a separate and distinct component in accordance with various aspects of the present disclosure. In other examples, band selection manager 1315 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

Band selection manager 1315 may be a program or instructions implemented by a controller to perform the functions of the receiver described herein. To extract narrow-band signals and perform other functions, the controller may be configured to bias gates of switches and control other voltages.

Transmitter 1320 may transmit signals generated by other components of the device. In some examples, the transmitter 1320 may be collocated with a receiver 1310 in a transceiver module. For example, the transmitter 1320 may be an example of aspects of the transceiver 1435 described with reference to FIG. 14. The transmitter 1320 may utilize a single antenna or a set of antennas.

Figure 14:
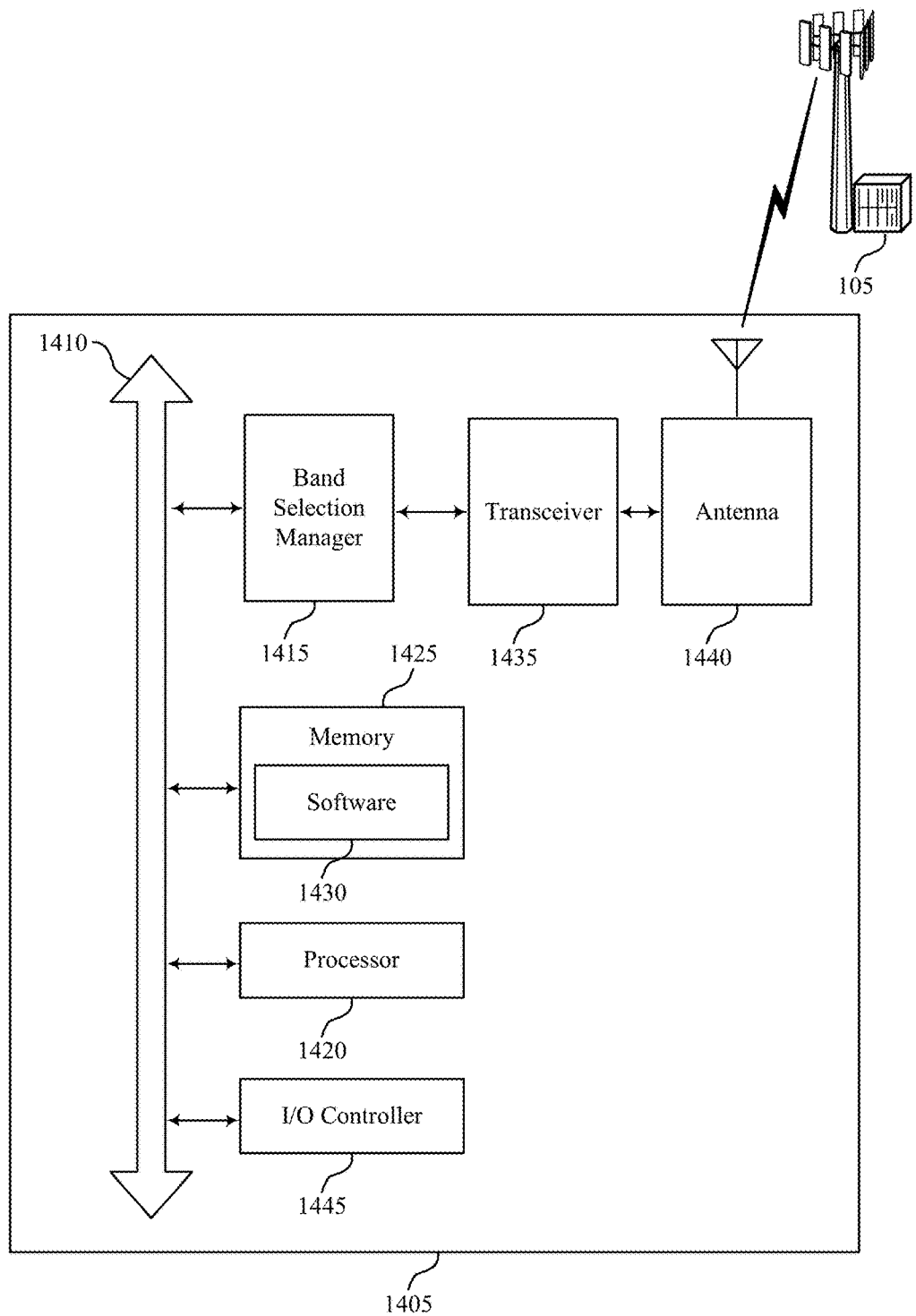
FIG. 14 illustrates a block diagram of a system including a UE that supports multi-band radio-frequency reception in accordance with aspects of the present disclosure.

FIG. 14 shows a diagram of a system 1400 including a device 1405 that supports multi-band radio-frequency reception in accordance with aspects of the present disclosure. Device 1405 may be an example of or include the components of wireless device 1305, wireless device 1305, or a UE 115 as described above, e.g., with reference to FIGS. 1 and 13. Device 1405 may include components for bi-directional voice and data communications including components for transmitting and receiving communications, including band selection manager 1415, processor 1420, memory 1425, software 1430, transceiver 1435, antenna 1440, and I/O controller 1445. These components may be in electronic communication via one or more busses (e.g., bus 1410). Device 1405 may communicate wirelessly with one or more base stations 105.

Processor 1420 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 1420 may be configured to operate a memory array using a memory controller. In other cases, a memory controller may be integrated into processor 1420. Processor 1420 may be configured to execute computer-readable instructions stored in a memory to perform various functions (e.g., functions or tasks supporting multi-band radio-frequency reception). In some cases, the processor 1420 may be an example of the controller that implements the band selection manager 1415. In such cases, the band selection manager 1415 may be part of the processor 1420.

Memory 1425 may include random access memory (RAM) and read only memory (ROM). The memory 1425 may store computer-readable, computer-executable software 1430 including instructions that, when executed, cause the processor to perform various functions described herein. In some cases, the memory 1425 may contain, among other things, a basic input/output system (BIOS) which may control basic hardware and/or software operation such as the interaction with peripheral components or devices.

Software 1430 may include code to implement aspects of the present disclosure, including code to support multi-band radio-frequency reception. Software 1430 may be stored in a non-transitory computer-readable medium such as system memory or other memory. In some cases, the software 1430 may not be directly executable by the processor but may cause a computer (e.g., when compiled and executed) to perform functions described herein.

Transceiver 1435 may communicate bi-directionally, via one or more antennas, wired, or wireless links as described above. For example, the transceiver 1435 may represent a wireless transceiver and may communicate bi-directionally with another wireless transceiver. The transceiver 1435 may also include a modem to modulate the packets and provide the modulated packets to the antennas for transmission, and to demodulate packets received from the antennas.

In some cases, the wireless device may include a single antenna 1440. However, in some cases the device may have more than one antenna 1440, which may be capable of concurrently transmitting or receiving multiple wireless transmissions.

I/O controller 1445 may manage input and output signals for device 1405. I/O controller 1445 may also manage peripherals not integrated into device 1405. In some cases, I/O controller 1445 may represent a physical connection or port to an external peripheral. In some cases, I/O controller 1445 may utilize an operating system such as iOS®, ANDROID®, MS-DOS®, MS-WINDOWS®, OS/2®, UNIX®, LINUX®, or another known operating system. In other cases, I/O controller 1445 may represent or interact with a modem, a keyboard, a mouse, a touchscreen, or a similar device. In some cases, I/O controller 1445 may be implemented as part of a processor. In some cases, a user may interact with device 1405 via I/O controller 1445 or via hardware components controlled by I/O controller 1445.

Figure 15:
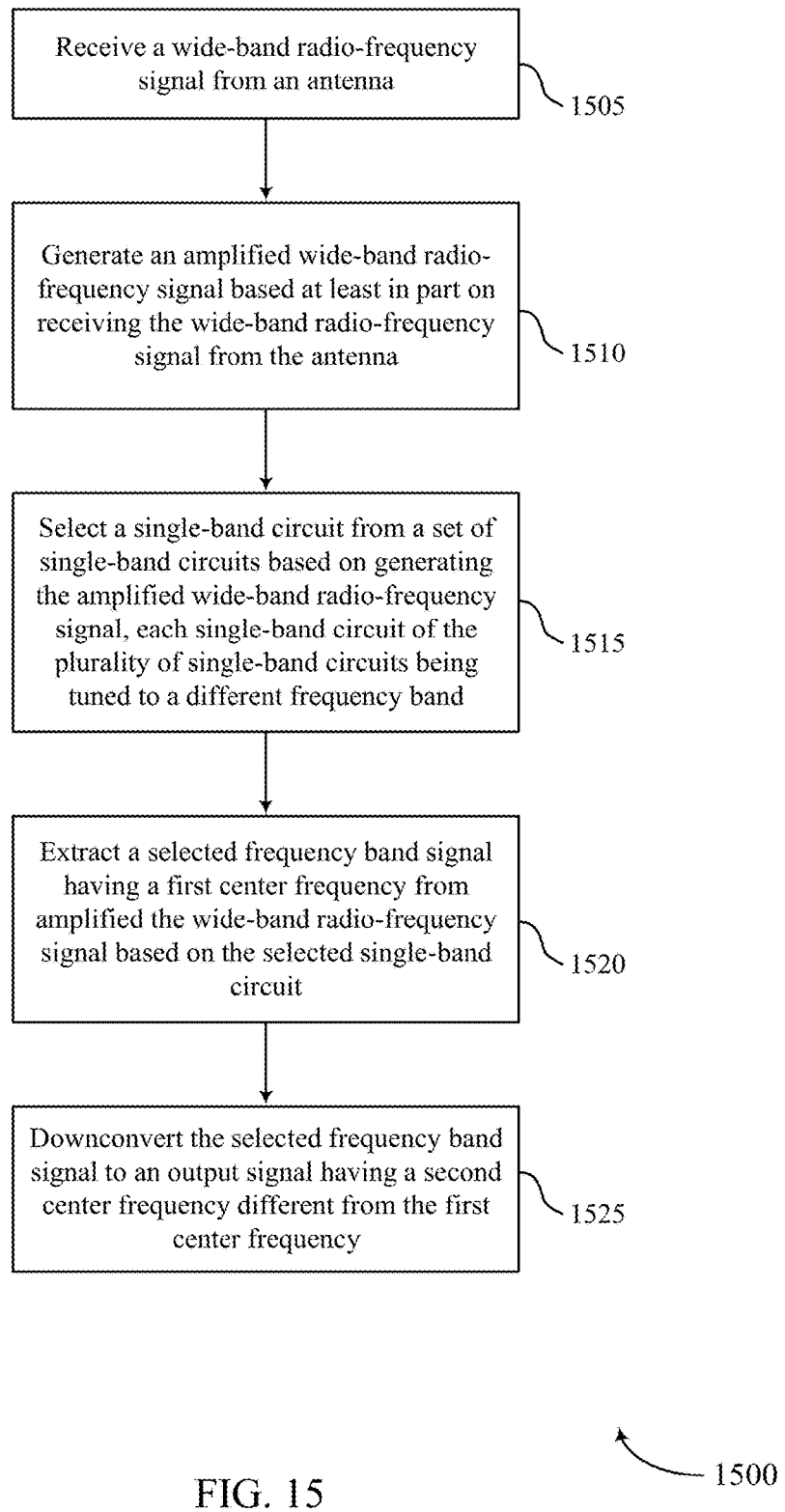
FIGS. 15 through 16 illustrate methods for multi-band radio-frequency reception in accordance with aspects of the present disclosure.

FIG. 15 shows a flowchart illustrating a method 1500 for multi-band radio-frequency reception in accordance with aspects of the present disclosure. The operations of method 1500 may be implemented by a UE 115 or its components as described herein. For example, the operations of method 1500 may be performed by a receiver and/or a band selection manager as described with reference to FIGS. 13 and 14. In some examples, a UE 115 may execute a set of codes to control the functional elements of the device to perform the functions described below. Additionally or alternatively, the UE 115 may perform aspects of the functions described below using special-purpose hardware.

At block 1505 the UE 115 may receive a wide-band radio-frequency signal from an antenna. The operations of block 1505 may be performed according to the methods described with reference to FIGS. 1 through 12. In certain examples, aspects of the operations of block 1505 may be performed by a receiver as described with reference to FIGS. 3 through 14.

At block 1510 the UE 115 may generate an amplified wide-band radio-frequency signal based at least in part on receiving the wide-band radio-frequency signal from the antenna. The operations of block 1510 may be performed according to the methods described with reference to FIGS. 3 through 12. In certain examples, aspects of the operations of block 1510 may be performed by a transconductance amplifier as described with reference to FIGS. 3 through 14.

At block 1515 the UE 115 may select a single-band circuit from a plurality of single-band circuits based at least in part generating on the amplified wide-band radio-frequency signal, each single-band circuit of the plurality of single-band circuits being tuned to a different frequency band. The operations of block 1515 may be performed according to the methods described with reference to FIGS. 1 through 12. In certain examples, aspects of the operations of block 1515 may be performed by a transconductance amplifier as described with reference to FIGS. 3 through 13.

At block 1520 the UE 115 may extract a selected frequency band signal having a first center frequency from the amplified wide-band radio-frequency signal based at least in part on the selected single-band circuit. The operations of block 1520 may be performed according to the methods described with reference to FIGS. 1 through 12. In certain examples, aspects of the operations of block 1520 may be performed by a single-band circuit as described with reference to FIGS. 3 through 13.

At block 1525 the UE 115 may downconvert the selected frequency band signal to an output signal having a second center frequency different from the first center frequency. The operations of block 1525 may be performed according to the methods described with reference to FIGS. 1 through 12. In certain examples, aspects of the operations of block 1525 may be performed by a downconverter as described with reference to FIGS. 3 through 13.

Figure 16:
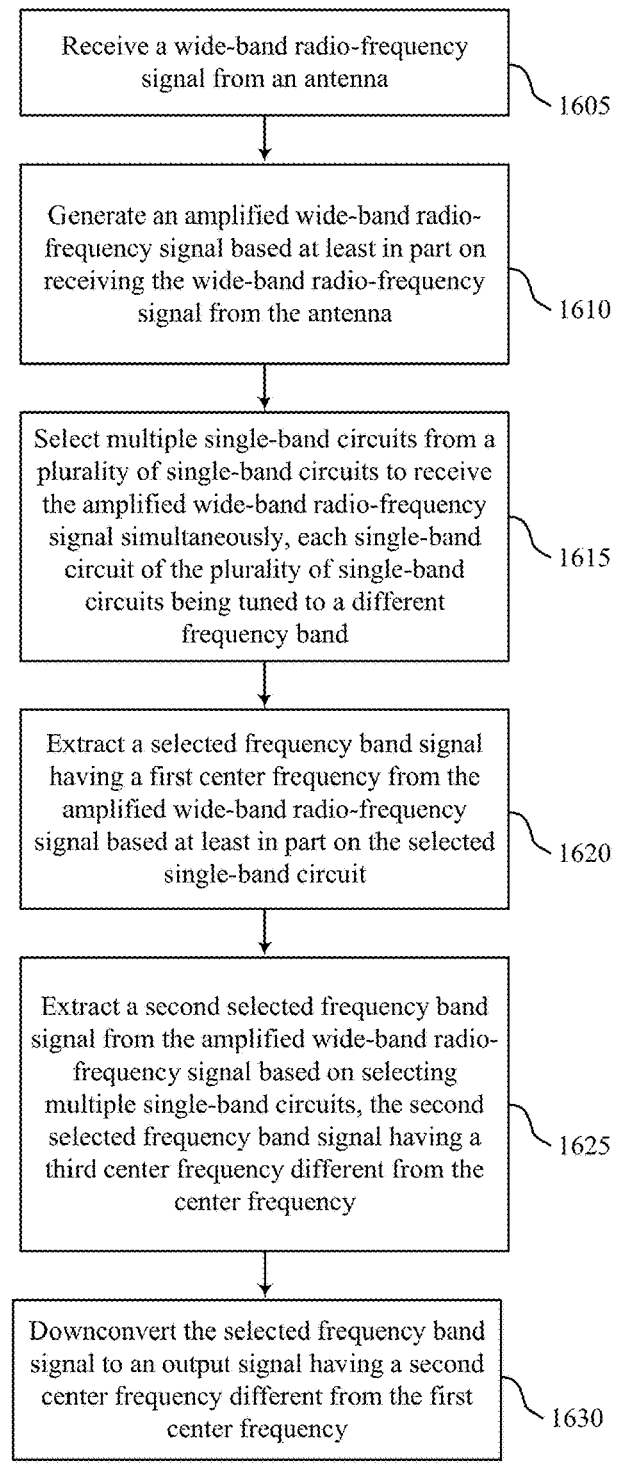

FIG. 16 shows a flowchart illustrating a method 1600 for multi-band radio-frequency reception in accordance with aspects of the present disclosure. The operations of method 1600 may be implemented by a UE 115 or its components as described herein. For example, the operations of method 1600 may be performed by a receiver and/or a band selection manager as described with reference to FIGS. 13 through 14. In some examples, a UE 115 may execute a set of codes to control the functional elements of the device to perform the functions described below. Additionally or alternatively, the UE 115 may perform aspects of the functions described below using special-purpose hardware.

At block 1605 the UE 115 may receive a wide-band radio-frequency signal from an antenna. The operations of block 1605 may be performed according to the methods described with reference to FIGS. 1 through 12. In certain examples, aspects of the operations of block 1605 may be performed by a receiver as described with reference to FIGS. 3 through 13.

At block 1610 the UE 115 may generate an amplified wide-band radio-frequency signal based at least in part on receiving the wide-band radio-frequency signal from the antenna. The operations of block 1610 may be performed according to the methods described with reference to FIGS. 3 through 12. In certain examples, aspects of the operations of block 1610 may be performed by a transconductance amplifier as described with reference to FIGS. 3 through 14.

At block 1615 the UE 115 may select multiple single-band circuits from a plurality of single-band circuits to receive the amplified wide-band radio-frequency signal simultaneously, each single-band circuit of the plurality of single-band circuits being tuned to a different frequency band. The operations of block 1615 may be performed according to the methods described with reference to FIGS. 1 through 12. In certain examples, aspects of the operations of block 1615 may be performed by a transconductance amplifier as described with reference to FIGS. 3 through 13.

At block 1620 the UE 115 may extract a selected frequency band signal having a first center frequency from the amplified wide-band radio-frequency signal based at least in part on the selected single-band circuit. The operations of block 1620 may be performed according to the methods described with reference to FIGS. 1 through 12. In certain examples, aspects of the operations of block 1620 may be performed by a single-band circuit as described with reference to FIGS. 3 through 13.

At block 1625 the UE 115 may extract a second selected frequency band signal from the amplified wide-band radio-frequency signal based at least in part on selecting multiple single-band circuits, the second selected frequency band signal having a third center frequency different from the center frequency. The operations of block 1625 may be performed according to the methods described with reference to FIGS. 1 through 12. In certain examples, aspects of the operations of block 1625 may be performed by a single-band circuit as described with reference to FIGS. 3 through 13.

At block 1630 the UE 115 may downconvert the selected frequency band signal to an output signal having a second center frequency different from the first center frequency. The operations of block 1630 may be performed according to the methods described with reference to FIGS. 1 through 12. In certain examples, aspects of the operations of block 1630 may be performed by a downconverter as described with reference to FIGS. 3 through 13.

It should be noted that the methods described above describe possible implementations, and that the operations and the steps may be rearranged or otherwise modified and that other implementations are possible. Furthermore, aspects from two or more of the methods may be combined.

The downlink transmissions described herein may also be called forward link transmissions while the uplink transmissions may also be called reverse link transmissions. Each communication link described herein—including, for example, wireless communications system 100 and 200 of FIGS. 1 and 2—may include one or more carriers, where each carrier may be a signal made up of multiple sub-carriers (e.g., waveform signals of different frequencies).

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A device for wireless communication, comprising:
a plurality of single-band circuits, each single-band circuit being tuned to a different frequency band; and
an amplifier comprising a transistor and coupled with the plurality of single-band circuits, the amplifier configured to receive a wide-band radio-frequency voltage signal at a gate of the transistor and select a single-band circuit from the plurality of single-band circuits, the selected single-band circuit configured to:
extract a selected frequency band signal from an amplified wide-band radio-frequency signal received from the amplifier; and
downconvert the selected frequency band signal.

2. The device of claim 1, further comprising:
an antenna configured to provide the wide-band radio-frequency voltage signal.

3. The device of claim 1, further comprising:
a single output path coupled with each of the plurality of single-band circuits.

4. The device of claim 1, wherein the amplifier is a transconductance amplifier.

5. The device of claim 1, wherein the selected single-band circuit further comprises:
a downconverter configured to shift a center frequency of the selected frequency band signal to an intermediate frequency.

6. The device of claim 1, further comprising:
a phased-array antenna having a plurality of elements, each element having a plurality of single-band circuits, wherein the amplifier is coupled with one element of the plurality of elements.

7. The device of claim 1, wherein the selected single-band circuit further comprises:
a first tuned circuit that is tuned to a center frequency and coupled with the amplifier, the first tuned circuit configured to extract the selected frequency band signal from the amplified wide-band radio-frequency signal based at least in part on the center frequency.

8. The device of claim 7, wherein the selected single-band circuit further comprises:
a second tuned circuit that is tuned to the center frequency and coupled with an output path, the second tuned circuit configured to extract the selected frequency band signal from an output of the first tuned circuit based at least in part on the center frequency.

9. The device of claim 1, wherein the amplifier comprises:
a single input port coupled with an antenna; and
the amplifier further comprising a plurality of output ports, each output port coupled with one of the plurality of single-band circuits.

10. The device of claim 1, wherein the amplifier comprises:
selection circuitry that includes a plurality of transistors, wherein the amplifier outputs the amplified wide-band radio-frequency signal to the selected single-band circuit based at least in part on which transistor of the plurality of transistors is activated.

11. The device of claim 1, further comprising:
a downconverter coupled with at least one single-band circuit of the plurality of single-band circuits, the downconverter configured to shift a center frequency of the selected frequency band signal from a first value to a second value less than the first value.

12. The device of claim 1, wherein the amplifier is configured to output the amplified wide-band radio-frequency signal to multiple single-band circuits of the plurality of single-band circuits simultaneously.

13. The device of claim 1, further comprising:
an output path having a first output line coupled with the plurality of single-band circuits, the first output line configured to carry a first portion of the selected frequency band signal of the selected single-band circuit, and a second output line coupled with the plurality of single-band circuits, the second output line configured to carry a second portion of the selected frequency band signal.

14. The device of claim 1, wherein the amplified wide-band radio-frequency signal is an amplified wide-band millimeter-wave signal.

15. A method for wireless communication, comprising:
receiving a wide-band radio-frequency voltage signal from an antenna at a gate of a transistor;

generating an amplified wide-band radio-frequency signal based at least in part on receiving the wide-band radio-frequency voltage signal from the antenna;

selecting a single-band circuit from a plurality of single-band circuits based at least in part on generating the amplified wide-band radio-frequency signal each single-band circuit of the plurality of single-band circuits being tuned to a different frequency band;

extracting a selected frequency band signal having a first center frequency from the amplified wide-band radio-frequency signal based at least in part on the selected single-band circuit; and downconverting the selected frequency band signal to an output signal having a second center frequency different from the first center frequency.

16. The method of claim 15, further comprising:
receiving a plurality of wide-band radio-frequency voltage signals from a plurality of elements of a phased-array antenna, wherein the antenna is one of the plurality of elements of the phased-array antenna.

17. The method of claim 16, further comprising:
combining output signals received from the plurality of elements of the phased-array antenna.

18. The method of claim 15, further comprising:
applying a voltage to a specific transistor of a plurality of transistors of a transconductance amplifier, wherein selecting the single-band circuit is based at least in part on applying the voltage to the specific transistor.

19. The method of claim 15, further comprising:
selecting multiple single-band circuits from the plurality of single-band circuits to receive the amplified wide-band radio-frequency signal simultaneously.

20. The method of claim 19, further comprising:
extracting a second selected frequency band signal from the amplified wide-band radio-frequency signal based at least in part on selecting multiple single-band circuits, the second selected frequency band signal having a third center frequency different from the first center frequency.

21. The method of claim 15, wherein the wide-band radio-frequency voltage signal is a wide-band millimeter-wave signal.

22. An apparatus for wireless communication, comprising:
means for receiving a wide-band radio-frequency voltage signal from an antenna at a gate of a transistor;

means for generating an amplified wide-band radio-frequency signal based at least in part on receiving the wide-band radio-frequency voltage signal from the antenna;

means for selecting a single-band circuit from a plurality of single-band circuits based at least in part on generating the amplified wide-band radio-frequency signal, each single-band circuit of the plurality of single-band circuits being tuned to a different frequency band;

means for extracting a selected frequency band signal having a first center frequency from the amplified wide-band radio-frequency signal based at least in part on the selected single-band circuit; and means for downconverting the selected frequency band signal to an output signal having a second center frequency different from the first center frequency.

23. The apparatus of claim 22, further comprising:
means for receiving a plurality of wide-band radio-frequency voltage signals from a plurality of elements of a phased-array antenna, wherein the antenna is one of the plurality of elements of the phased-array antenna.

24. The apparatus of claim 23, further comprising:
means for combining output signals received from the plurality of elements of the phased-array antenna.

25. The apparatus of claim 22, further comprising:
means for applying a voltage to a specific transistor of a plurality of transistors of a transconductance amplifier, wherein selecting the single-band circuit is based at least in part on applying the voltage to the specific transistor.

* * * * *